(12) United States Patent
Kim et al.

(10) Patent No.: US 11,195,952 B2
(45) Date of Patent: Dec. 7, 2021

(54) SEMICONDUCTOR DEVICES INCLUDING A STRESS PATTERN

(71) Applicant: Samsung Electronics Co., Ltd., Suwon-si (KR)

(72) Inventors: Sung Min Kim, Incheon (KR); Hyo Jin Kim, Seoul (KR); Dae Won Ha, Seoul (KR)

(73) Assignee: Samsung Electronics Co., Ltd.

( * ) Notice: Subject to any disclaimer, the term of this patent is extended or adjusted under 35 U.S.C. 154(b) by 0 days.

(21) Appl. No.: 16/402,292

(22) Filed: May 3, 2019

(65) Prior Publication Data
US 2020/0083377 A1  Mar. 12, 2020

(30) Foreign Application Priority Data
Sep. 11, 2018 (KR) .................. 10-2018-0108380

(51) Int. Cl.
*H01L 29/78* (2006.01)
*H01L 21/762* (2006.01)

(52) U.S. Cl.
CPC .... *H01L 29/7849* (2013.01); *H01L 21/76224* (2013.01); *H01L 29/785* (2013.01)

(58) Field of Classification Search
USPC ........................................................ 257/401
See application file for complete search history.

(56) References Cited

U.S. PATENT DOCUMENTS

| | | |
|---|---|---|
| 2007/0257249 A1 | 11/2007 | Mocuta et al. |
| 2014/0353731 A1 | 12/2014 | Colinge et al. |
| 2014/0367800 A1 | 12/2014 | Lee et al. |
| 2015/0129979 A1 | 5/2015 | Lee et al. |
| 2016/0005852 A1 | 1/2016 | Kim et al. |
| 2016/0322477 A1 | 11/2016 | Huang et al. |
| 2017/0110579 A1 | 4/2017 | Chang et al. |
| 2017/0117391 A1 | 4/2017 | Ching et al. |
| 2017/0179284 A1 | 6/2017 | Kim et al. |
| 2020/0058761 A1* | 2/2020 | Ho ............... H01L 29/66795 |

* cited by examiner

*Primary Examiner* — Hrayr A Sayadian
(74) *Attorney, Agent, or Firm* — Myers Bigel, P.A.

(57) ABSTRACT

Semiconductor devices are provided. A semiconductor device includes a fin structure including a stress structure and a semiconductor region that are sequentially stacked on a substrate. The semiconductor device includes a field insulation layer on a portion of the fin structure. The semiconductor device includes a gate electrode on the fin structure. Moreover, the stress structure includes an oxide.

20 Claims, 42 Drawing Sheets

SEMICONDUCTOR DEVICES INCLUDING A STRESS PATTERN

CROSS-REFERENCE TO RELATED APPLICATION

This application claims priority under 35 U.S.C. § 119 to Korean Patent Application No. 10-2018-0108380 filed on Sep. 11, 2018 in the Korean Intellectual Property Office, the disclosure of which is hereby incorporated herein by reference in its entirety.

BACKGROUND

The present disclosure relates to semiconductor devices. To increase the integration of an integrated circuit device, a multi-gate transistor including a fin-shaped or nanowire-shaped silicon body on a substrate and a gate on the silicon body has been proposed. Because a multi-gate transistor can utilize a three-dimensional channel, it can be scaled.

Further, current control capability of the multi-gate transistor can be improved without increasing a gate length thereof. A short channel effect (SCE) in which the electrical potential of the channel region is affected by the drain voltage can be effectively reduced and/or suppressed in the multi-gate transistor. A layer containing a stress material may be formed in a silicon body of fin type to increase a carrier mobility in a channel region of a semiconductor device.

SUMMARY

According to example embodiments of the inventive concepts, a semiconductor device may include a substrate. The semiconductor device may include a fin structure including a stress pattern and a semiconductor pattern that are sequentially stacked on the substrate. The semiconductor device may include a field insulation layer on a portion of the fin structure. The semiconductor device may include a gate electrode on the fin structure. The gate electrode may intersect the fin structure and extend in a first direction. Moreover, the stress pattern may include a first oxide pattern and a second oxide pattern that are spaced apart from each other in a second direction that is different from the first direction.

According to example embodiments of the inventive concepts, a semiconductor device may include a substrate. The semiconductor device may include a fin structure including a stress structure and a first semiconductor region that are sequentially stacked on the substrate. The semiconductor device may include a field insulation layer on a portion of the fin structure. The semiconductor device may include a gate electrode on the fin structure and the field insulation layer. The gate electrode may intersect the fin structure. The stress structure may include a first oxide region including germanium. The stress structure may include a second oxide region that is spaced apart from the first oxide region. The second oxide region may include germanium. Moreover, the stress structure may include a second semiconductor region between the first oxide region and the second oxide region. The second semiconductor region may be free of germanium.

According to example embodiments of the inventive concepts, a semiconductor device may include a substrate. The semiconductor device may include a fin structure on the substrate. The semiconductor device may include a field insulation layer on a sidewall portion of the fin structure. The semiconductor device may include a gate electrode on the fin structure, and the gate electrode may intersect the fin structure. Moreover, the fin structure may include a first semiconductor layer, a stress region, and a second semiconductor layer that are sequentially stacked on the substrate. The stress region may include an oxide including germanium. A first angle between an upper surface of the first semiconductor layer and a first line parallel to an upper surface of the substrate may be different from a second angle between a lower surface of the second semiconductor layer and a second line parallel to the upper surface of the substrate.

DETAILED DESCRIPTION

Figure 1:
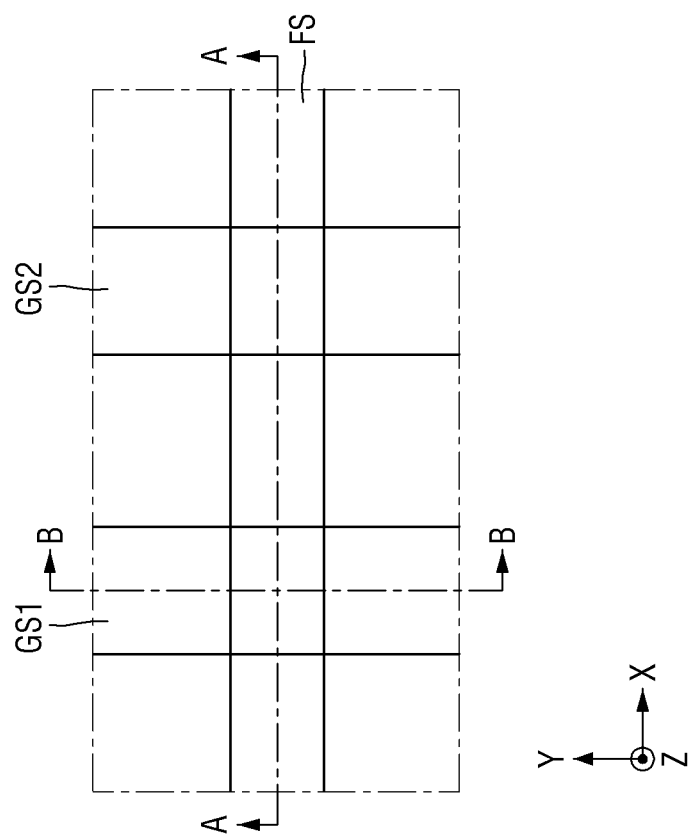
FIG. 1 is a layout diagram illustrating a semiconductor device according to example embodiments.

Various example embodiments will now be described more fully with reference to the accompanying drawings in which some example embodiments are shown. However, the inventive concepts may be embodied in many alternate forms and should not be construed as limited to only example embodiments set forth herein.

In the drawings of the semiconductor device according to example embodiments of the inventive concepts, a fin transistor (FinFET) including a channel region of fin type is illustrated, but the inventive concepts are not limited thereto. The semiconductor device according to example embodiments of the inventive concepts may include a tunneling transistor, a three dimensional transistor, a transistor including a nanowire-shaped channel, or a transistor including nanosheet-shaped channel region. The semiconductor device according to embodiments of the inventive concepts may include a bipolar junction transistor, a lateral double diffused transistor (LDMOS), or the like.

Figure 2:
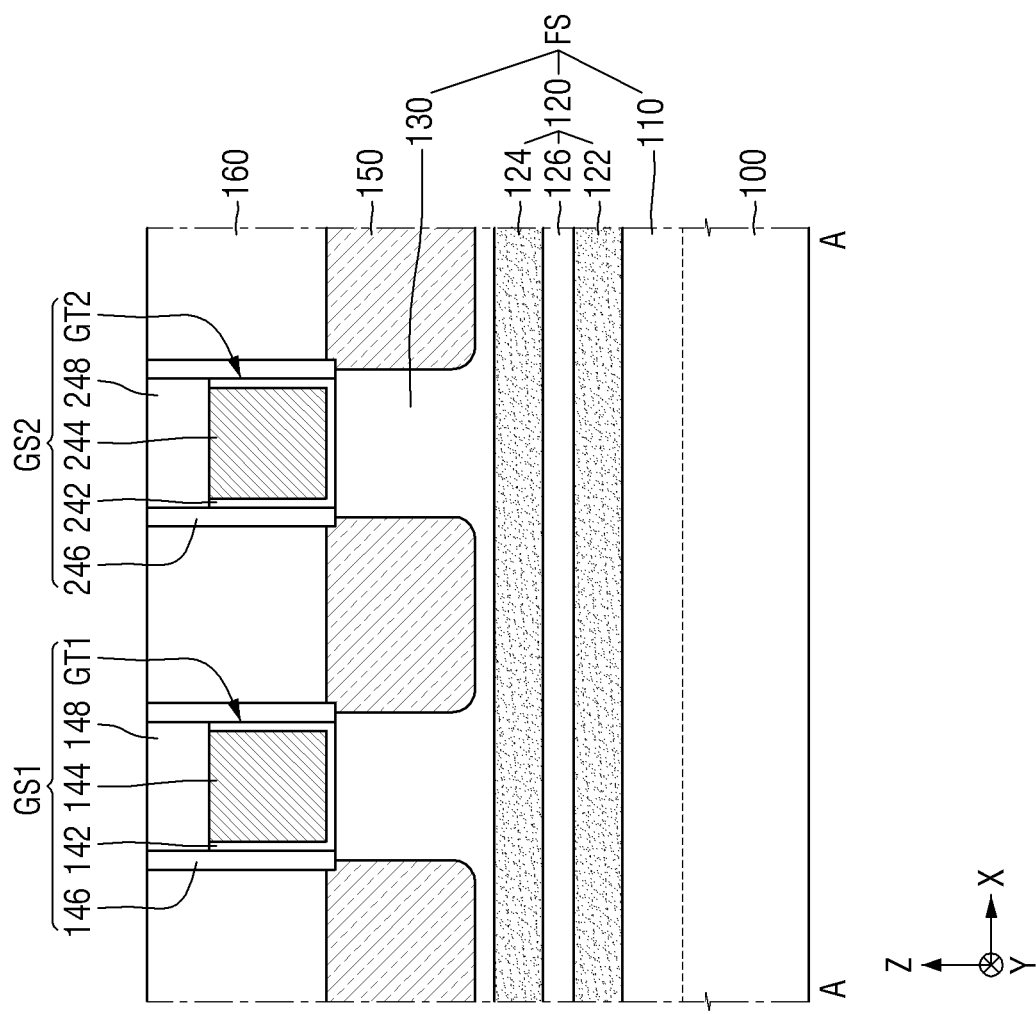
FIG. 2 is a cross-sectional view taken along line A-A of FIG. 1, illustrating a semiconductor device according to example embodiments.
Figure 3:
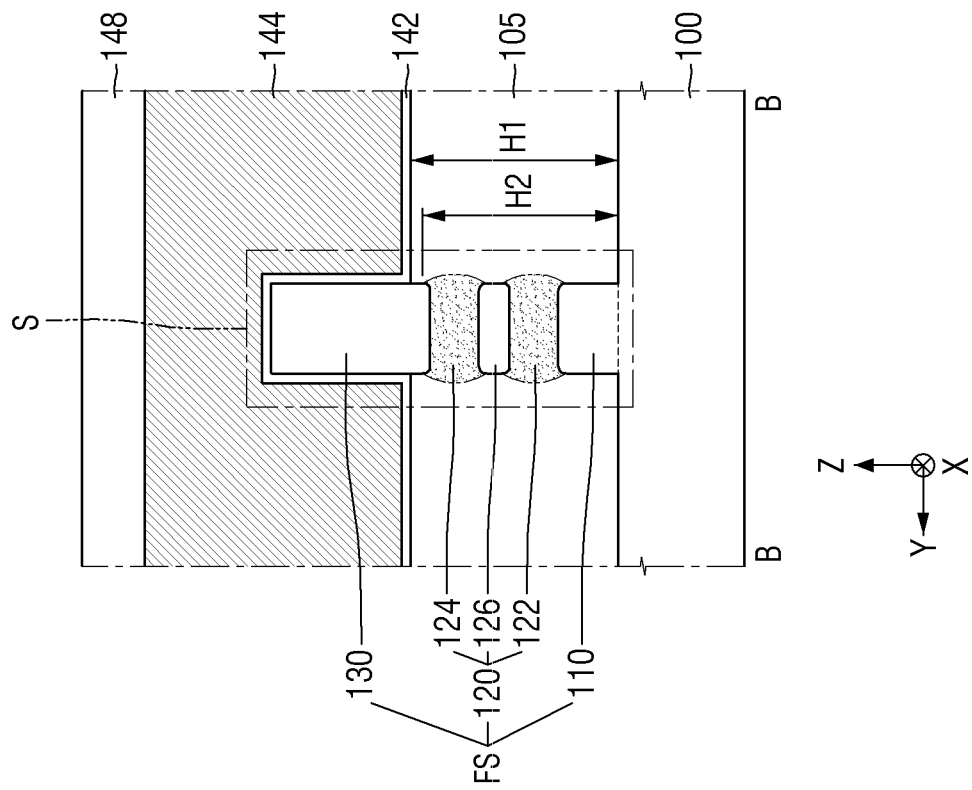
FIG. 3 is a cross-sectional view taken along line B-B of FIG. 1, illustrating a semiconductor device according to example embodiments.
Figure 4:
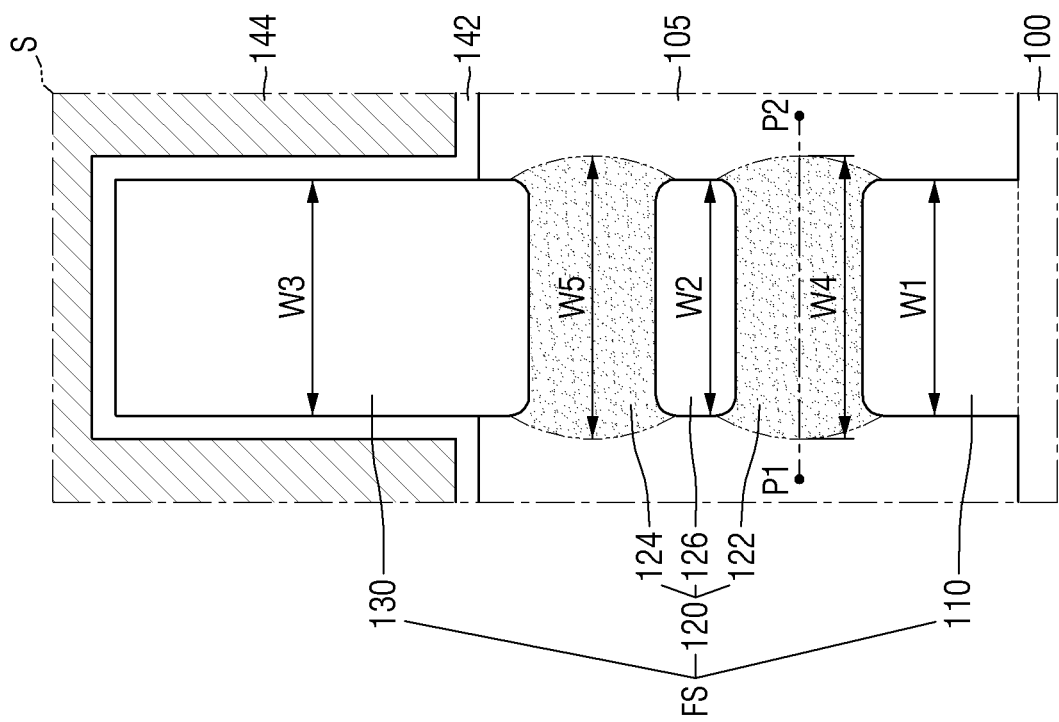
FIG. 4 is an enlarged view of portion S of FIG. 3.
Figure 5:
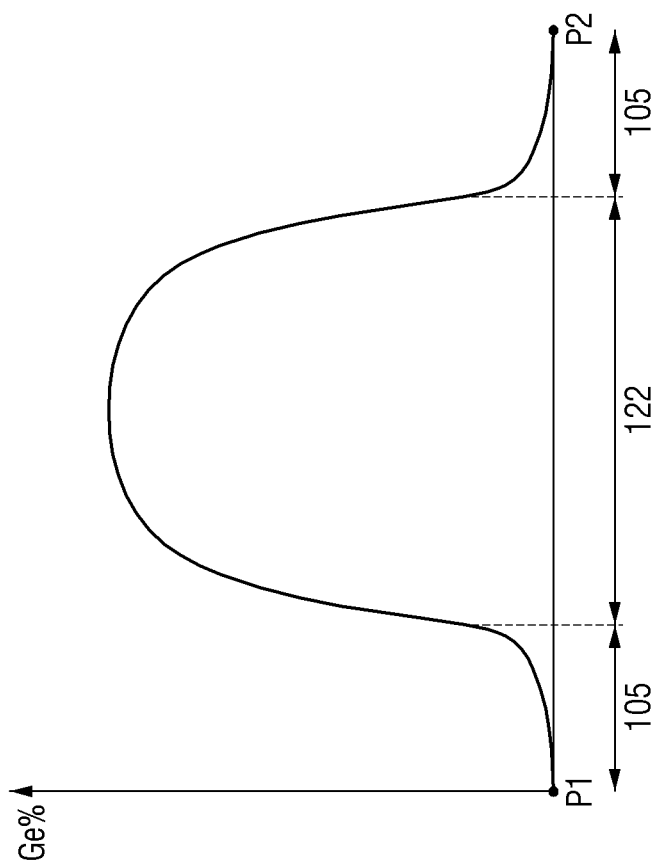
FIG. 5 is a graph illustrating a change in a germanium concentration along a first scan line P1-P2 of FIG. 4.

FIG. 1 is a layout diagram illustrating a semiconductor device according to example embodiments. FIG. 2 is a cross-sectional view taken along line A-A of FIG. 1, illustrating a semiconductor device according to example embodiments. FIG. 3 is a cross-sectional view taken along line B-B of FIG. 1, illustrating a semiconductor device according to example embodiments. FIG. 4 is an enlarged view of portion S of FIG. 3. FIG. 5 is a graph illustrating a change in a germanium concentration along a first scan line P1-P2 of FIG. 4.

Referring to FIGS. 1 to 5, a semiconductor device according to example embodiments may include a substrate 100, a first fin structure FS, a field insulation layer 105, a first gate structure GS1, a second gate structure GS2, source/drain regions 150, and an interlayer insulation layer 160.

The substrate 100 may be a bulk silicon substrate, or a silicon-on-insulator (SOI) substrate. In some embodiments, the substrate 100 may include for example, silicon germanium, silicon germanium on insulator (SGOI), indium antimonide, lead tellurium compound, indium arsenide, indium phosphide, gallium arsenide or gallium antimonide, but is not limited thereto.

The substrate 100 may include a first fin structure FS. The first fin structure FS may protrude from the substrate 100. The first fin structure FS may extend in a first direction X parallel to an upper surface of the substrate 100.

The first fin structure FS may include a first semiconductor pattern 110, a stress pattern 120, and a third semiconductor pattern 130 sequentially stacked on the substrate 100.

The first semiconductor pattern 110 may protrude from the substrate 100 and may extend in a first direction X. The first semiconductor pattern 110 may be a portion of the substrate 100 or may include an epitaxial layer grown from the substrate 100.

The first semiconductor pattern 110 may include a first semiconductor material. For example, the first semiconductor material may include silicon (Si) or germanium (Ge). The fin structure FS may include a compound semiconductor, for example, a group IV-IV compound semiconductor or a group III-V compound semiconductor. Hereinafter, it will be described that the first semiconductor pattern 110 includes silicon.

The stress pattern 120 may be formed on the first semiconductor pattern 110. The stress pattern 120 may extend in the first direction X.

The stress pattern 120 may include an oxide of a second semiconductor material. The second semiconductor material may be a material having an oxidation rate faster than that of the first semiconductor material. For example, when the first semiconductor material is silicon, the second semiconductor material may be germanium (Ge). The stress pattern 120 may include at least one of silicon-germanium oxide, silicon-germanium-carbide oxide, and germanium oxide.

In some embodiments, the stress pattern 120 may include a plurality of oxide patterns. For example, as shown in FIGS. 2 to 4, the stress pattern 120 may include a first oxide pattern 122 and a second oxide pattern 124. The first oxide pattern 122 and the second oxide pattern 124 may be spaced apart from each other with a second semiconductor pattern 126 therebetween. The stress pattern 120 may include the second semiconductor pattern 126. In some embodiments, the stress pattern 120 may include three or more oxide patterns spaced apart from each other.

Moreover, though the term "pattern" is used in examples herein to describe elements 110, 122, 124, 126, and 130, these elements may comprise respective layers/regions and are not limited to patterns. Accordingly, elements 110, 122, 124, 126, and 130 may be referred to herein as a first semiconductor layer/region, a first oxide layer/region, a second oxide layer/region, a second semiconductor layer/region, and a third semiconductor layer/region, respectively. Similarly, element 120 may be a structure/region that is not limited to a pattern, and thus may be referred to herein as a "stress structure" or "stress region." Additionally or alternatively, element 130 may be referred to herein using the term "first" or the term "second," and element 110 may be referred to herein using the term "second" or the term "third," as these terms do not necessarily imply a particular sequence in a fin structure FS.

In some embodiments, the first oxide pattern 122 and the second oxide pattern 124 may be spaced apart from each other in a third direction Z vertical (e.g., perpendicular) to the upper surface of the substrate 100. The first oxide pattern 122, the second semiconductor pattern 126, and the second oxide pattern 124 may be vertically stacked on the substrate 100. The first oxide pattern 122, the second semiconductor pattern 126, and the second oxide pattern 124 may extend in the first direction X.

The first oxide pattern 122 and the second oxide pattern 124 may include an oxide of the second semiconductor material. The first oxide pattern 122 and the second oxide pattern 124 may include at least one of silicon-germanium oxide, silicon-germanium-carbide oxide, and germanium oxide.

In some embodiments, the second semiconductor pattern 126 may be free of (i.e., may not include) germanium (Ge). For example, the second semiconductor pattern 126 may include the first semiconductor material, for example, silicon (Si).

The third semiconductor pattern 130 may be formed on the stress pattern 120. The third semiconductor pattern 130 may extend in the first direction X. In some embodiments, the third semiconductor pattern 130 may be a channel region of an NMOS transistor.

The third semiconductor pattern 130 may directly contact one of the first oxide pattern 122 and the second oxide pattern 124. For example, the third semiconductor pattern 130 may directly contact an upper surface of the second oxide pattern 124.

The third semiconductor pattern 130 may include a third semiconductor material. The third semiconductor material may be a material having an oxidation rate slower than that of the second semiconductor material. In some embodiments, the third semiconductor material may be the same as the first semiconductor material. For example, the third semiconductor pattern 130 may include silicon (Si).

In some embodiments, a semiconductor layer including silicon germanium (SiGe), silicon germanium carbide (SiGeC), or germanium (Ge) may be oxidized by an oxidation process, thus forming the stress pattern 120 including the first oxide pattern 122 and the second oxide pattern 124. However, a semiconductor layer including silicon (Si) having an oxidation rate slower than that of silicon-germanium (SiGe), silicon-germanium-carbide (SiGeC), or germanium (Ge) may not be oxidized by the oxidation process, thus forming the first semiconductor pattern 110 and the third semiconductor pattern 130.

In some embodiments, the stress pattern 120 may apply a tensile stress to the third semiconductor pattern 130. This may be caused by, for example, characteristics of the oxidation process for forming the stress pattern 120. For example, the semiconductor layer including silicon-germanium (SiGe), silicon-germanium-carbide (SiGeC), or germanium (Ge) may be expanded during the oxidation process, such that the stress pattern 120 may be formed. Thus, the tensile stress may be applied to the third semiconductor pattern 130, such that a carrier mobility in the third semiconductor pattern 130 may be increased.

In some embodiments, referring to FIG. 4, a width W4 of the first oxide pattern 122 and a width W5 of the second oxide pattern 124 may be greater than a width W1 of the first semiconductor pattern 110, a width W2 of the second semiconductor pattern 126, or a width W3 of the third semiconductor pattern 130. Herein, the term "width" means a width in a second direction Y parallel to the upper surface of the substrate 100 and crossing the first direction X. In some embodiments, the semiconductor layer including silicon-germanium (SiGe), silicon-germanium-carbide (SiGeC), or germanium (Ge) may be expanded during the oxidation process, thus forming the first oxide pattern 122 having the width W4 and the second oxide pattern 124 having the width W5.

In some embodiments, the width W4 of the first oxide pattern 122 may be the same as the width W5 of the second oxide pattern 124, but is not limited thereto. In some embodiments, the width W4 of the first oxide pattern 122 may be greater than the width W5 of the second oxide pattern 124.

The width W1 of the first semiconductor pattern 110, the width W2 of the second semiconductor pattern 126, and the width W3 of the third semiconductor pattern 130 may be the same, but are not limited thereto. In some embodiments, the width W1 of the first semiconductor pattern 110 may be greater than the width W2 of the second semiconductor pattern 126, and the width W2 of the second semiconductor pattern 126 may be greater than the width W3 of the third semiconductor pattern 130.

The field insulation layer 105 may be formed on the substrate 100. The field insulation layer 105 may be on (e.g., may cover) portions of sidewalls of the first fin structure FS. For example, the first fin structure FS may be defined by the field insulation layer 105.

In some embodiments, a height H1 of an upper surface of the field insulation layer 105 may be higher than a height of an uppermost surface of the stress pattern 120 with respect to the upper surface of the substrate 100. For example, the field insulation layer 105 may completely cover sidewalls of the stress pattern 120. A lower portion of the third semiconductor pattern 130 may be buried in the field insulation layer 105.

The field insulation layer 105 may include, for example, silicon oxide, silicon nitride, silicon oxynitride, or a combination thereof, but is not limited thereto.

In some embodiments, a germanium concentration in the first oxide pattern 122 and the second oxide pattern 124 may be greater than a germanium concentration in the field insulation layer 105. In some embodiments, referring to FIG. 5, a scan line P1-P2 crossing the first oxide pattern 122 along the second direction Y may be defined. The germanium concentration may rapidly increase from a boundary surface of the first oxide pattern 122 toward the inside of the first oxide pattern 122 along the scan line P1-P2.

In FIGS. 3 and 4, it is illustrated that a boundary between the first oxide pattern 122 and the field insulation layer 105 and a boundary between the second oxide pattern 124 and the field insulation layer 105 are visible, but the inventive concepts are not limited thereto. In some embodiments, since the field insulation layer 105, the first oxide pattern 122, and the second oxide pattern 124 include oxide, the boundary between the first oxide pattern 122 and the field insulation layer 105 and the boundary between the second oxide pattern 124 and the field insulation layer 105 may not appear visibly.

The first gate structure GS1 and the second gate structure GS2 may be formed on the first fin structure FS and the field insulation layer 105. The first gate structure GS1 and the second gate structure GS2 may intersect the first fin structure FS. For example, the first gate structure GS1 and the second gate structure GS2 may be spaced apart from each other in the first direction X and may extend in the second direction Y.

The first gate structure GS1 may include a first gate insulation layer 142, a first gate electrode 144, first gate spacers 146, a first gate trench GT1 defined by the first gate spacers 146, and a first capping pattern 148.

The second gate structure GS2 may include a second gate insulation layer 242, a second gate electrode 244, second gate spacers 246, a second gate trench GT2 defined by the second gate spacers 246, and a second capping pattern 248.

The first gate insulation layer 142 may be interposed between the first fin structure FS and the first gate electrode 144. The second gate insulation layer 242 may be interposed between the first fin structure FS and the second gate electrode 244. In some embodiments, the first gate insulation layer 142 may extend along a sidewall and a bottom surface of the first gate trench GT1, and the second gate insulation layer 242 may extend along a sidewall and a bottom surface of the second trench GT2.

The first gate insulation layer 142 and the second gate insulation layer 242 may include a high-k dielectric layer including a high-k dielectric material having a grater dielectric constant than that of silicon oxide. The first gate insulation layer 142 and the second gate insulation layer 242 may include hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, or a combination thereof.

The first gate electrode 144 may be formed on the first gate insulation layer 142. The second gate electrode 244 may be formed on the second gate insulation layer 242. The first gate electrode 144 may fill at least a portion of the first gate trench GT1. The second gate electrode 244 may fill at least a portion of the second gate trench GT2.

The first gate electrode 144 and the second gate electrode 244 may include, for example, titanium (Ti), tantalum (Ta), tungsten (W), aluminum (Al), cobalt (Co), or a combination thereof. In some embodiments, the first gate electrode 144 and the second gate electrode 244 may include, for example, silicon or silicon germanium.

The first gate electrode 144 and the second gate electrode 244 may each be formed of a single layer. In some embodiments, the first gate electrode 144 and the second gate electrode 244 may each include a work function adjusting layer and a filling layer on the work function adjusting layer.

The work function adjusting layer may include, for example, Ti, titanium nitride (TiN), titanium aluminide (TiAl), titanium aluminum nitride (TiAlN), titanium aluminum carbide (TiAlC), titanium aluminum carbonitride (TiAlCN), Ta, tantalum nitride (TaN), or a combination thereof, but is not limited thereto. The filling layer may include, for example, W, Al, Co, Cu, ruthenium (Ru), nickel (Ni), platinum (Pt), Ni—Pt, TiN, or a combination thereof.

The first gate spacers 146 may be formed on sidewalls of the first gate electrode 144. The second gate spacers 246 may be formed on sidewalls of the second gate electrode 244.

The first gate spacers 146 and the second gate spacers 246 may each include, for example, silicon nitride, silicon oxynitride, silicon oxide, silicon oxycarbonitride, or a combination thereof.

The first capping pattern 148 may be formed on the first gate electrode 144. The second capping pattern 248 may be formed on the second gate electrode 244.

The first capping pattern 148 and the second capping pattern 248 may each include, for example, silicon nitride, silicon oxynitride, silicon oxide, silicon oxycarbonitride, or a combination thereof.

In some embodiments, the first gate spacers 146 may be formed on the sidewalls of the first gate electrode 144 and sidewalls of the first capping pattern 148, and the second gate spacers 246 may be formed on the sidewalls of the second gate electrode 244 and sidewalls of the second capping pattern 248. For example, referring to FIG. 2, the first gate electrode 144 may fill a portion of the first gate trench GT1, and the first capping pattern 148 may fill a remaining portion of the first gate trench GT1. The second gate electrode 244 may fill a portion of the second gate trench GT2, and the second capping pattern 248 may fill a remaining portion of the second gate trench GT2.

In some embodiments, the first capping pattern 148 may be formed on an upper surface of the first gate electrode 144 and upper surfaces of the first gate spacers 146. The second capping pattern 248 may be formed on an upper surface of the second gate electrode 244 and upper surfaces of the second gate spacers 246.

In some embodiments, the first and second capping patterns 148 and 248 may be omitted.

In some embodiments, the first gate structure GS1 and the second gate structure GS2 may be formed by the same process.

The source/drain regions 150 may be formed in the first fin structure FS. The source/drain regions 150 may be formed in the third semiconductor pattern 130 at opposite sides of the first gate electrode 144 and at opposite sides of the second gate electrode 244.

The source/drain regions 150 may each include an epitaxial layer formed on first fin structure FS. For example, the source/drain regions 150 may each be an epitaxial pattern filling a source/drain trench formed in the third semiconductor pattern 130. In some embodiments, the source/drain regions 150 may each be an impurity region formed in the third semiconductor pattern 130.

In some embodiments, the source/drain regions 150 may each be an elevated source/drain region having an upper surface protruding over/higher than the upper surface of the first fin structure FS.

In some embodiments, the source/drain regions 150 may each include an undercut formed below the first gate structure GS1 and the second gate structure GS2. This may be caused by characteristics of an etch process of forming the source/drain trench. However, the inventive concepts are not limited thereto. For example, the source/drain regions 150 may not each include the undercut.

The interlayer insulation layer 160 may be formed on the field insulation layer 105 and the source/drain regions 150. The interlayer insulation layer 160 may be on (e.g., may cover) the sidewalls of the first and second gate structures GS1 and GS2.

In some embodiments, the interlayer insulation layer 160 may further include an etch stop layer extending along upper surfaces of the source/drain regions 150.

The interlayer insulation layer 160 may include, for example, silicon oxide, silicon nitride, silicon oxynitride, flowable oxide (FOX), tonen silazene (TOSZ), undoped silica glass (USG), borosilica glass (BSG), phosphosilica glass (PSG), borophosphosilica glass (BPSG), plasma enhanced tetra ethyl ortho silicate (PETEOS), fluoride silicate glass (FSG), carbon doped silicon oxide (CDO), Xerogel, Aerogel, Amorphous Fluorinated Carbon, organo silicate glass (OSG), parylene, bis-benzocyclobutenes (BCB), SiLK, polyimide, porous polymeric material, or a combination thereof.

FIGS. 6 to 9 are cross-sectional views illustrating a semiconductor device according to example embodiments. FIGS. 6 to 9 are cross-sectional views taken along line A-A of FIG. 1. For convenience of explanation, elements duplicated with the examples described above will be described in brief or omitted.

Figure 6:
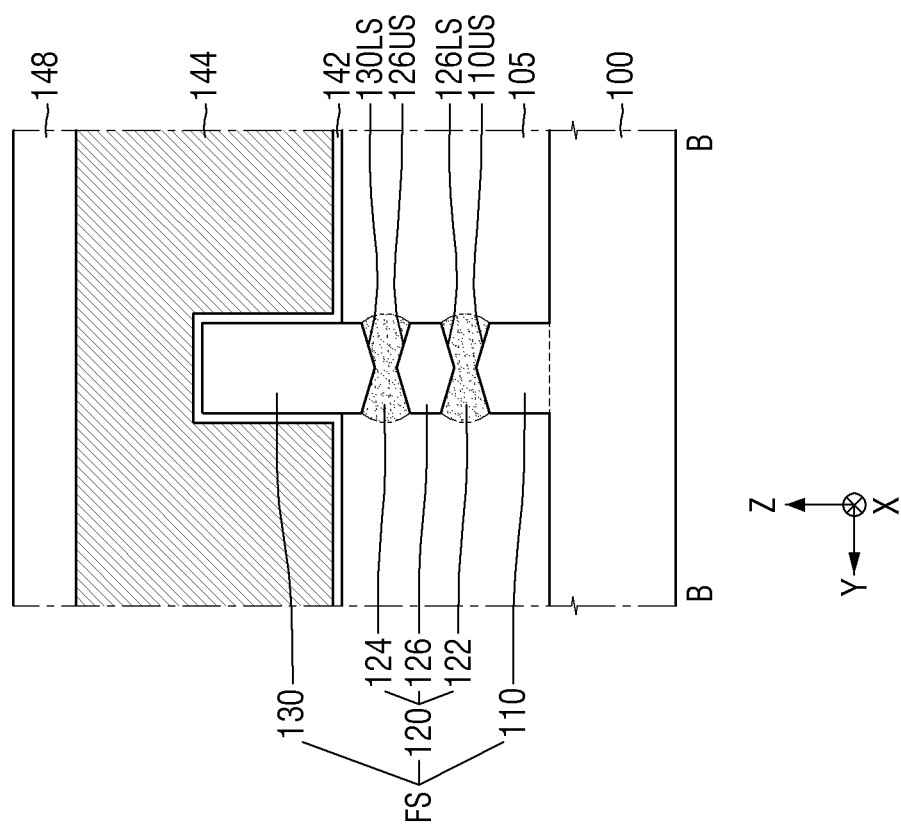
FIGS. 6 to 9 are cross-sectional views illustrating a semiconductor device according to example embodiments.

Referring to FIG. 6, in a semiconductor device according to example embodiments, the first semiconductor pattern 110, the second semiconductor pattern 126, and the third semiconductor pattern 130 may have respectively sloped surfaces 110US, 126LS, 126US, and 130US.

For example, an upper surface of the first semiconductor pattern 110 may have a first surface 110US having an acute angle with respect to the upper surface of the substrate 100. A lower surface of the second semiconductor pattern 126 may have a second surface 126LS having an acute angle with respect to the upper surface of the substrate 100. An upper surface of the second semiconductor pattern 126 may have a third surface 126US having an acute angle with respect to the upper surface of the substrate 100. A lower surface of the third semiconductor pattern 130 may have a fourth surface 130LS with respect to the upper surface of the substrate 100. The first to fourth surfaces 110US, 126LS, 126US, and 130LS may each extend in the first direction X. This may be caused by, for example, characteristics of an oxidation process of forming the stress pattern 120.

A height of the first surface 110US of the first semiconductor pattern 110 may increase as a distance from each sidewall of the first semiconductor pattern 110 increases. A height of the second surface 126LS of the second semiconductor pattern 126 may be reduced as a distance from each sidewall of the second semiconductor pattern 126 increases. Thus, as an example, the first oxide pattern 122 of dumbbell shape may be formed.

A height of the third surface 126US of the second semiconductor pattern 126 may increase as a distance from each sidewall of the second semiconductor pattern 126 increases. A height of the fourth surface 130LS of the third semiconductor pattern 130 may be reduced as a distance from each sidewall of the third semiconductor pattern 130 increases. Thus, as an example, the second oxide pattern 124 of dumbbell shape may be formed.

Figure 7:
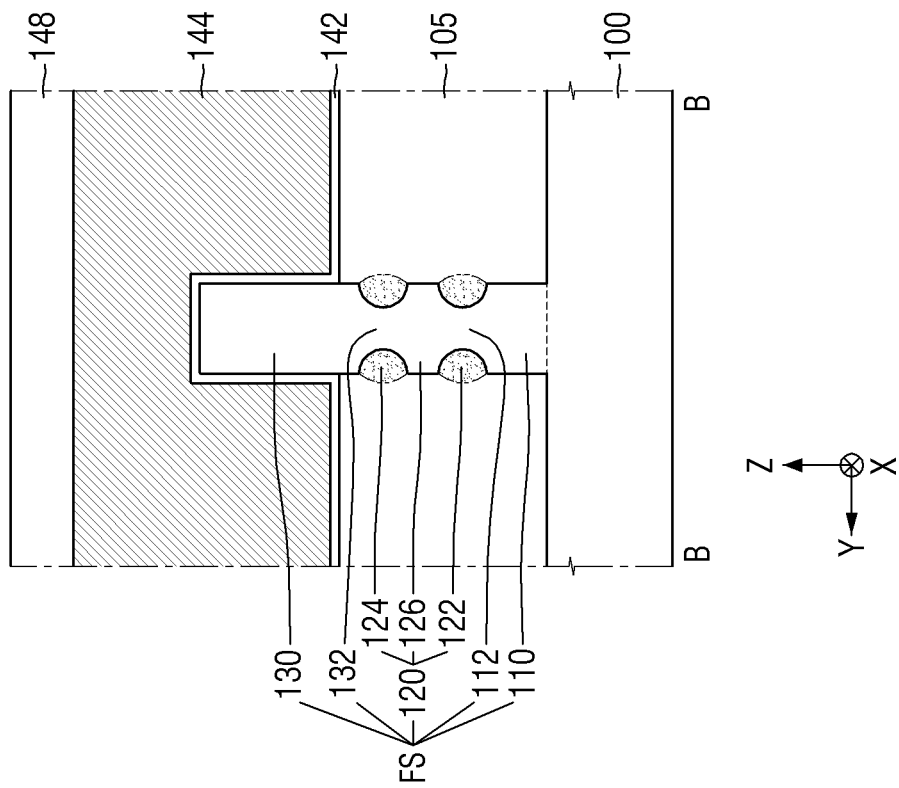

Referring to FIG. 7, in a semiconductor device according to example embodiments, the first fin structure FS may further include a first connection pattern 112 and a second connection pattern 132.

The first connection pattern 112 may cross/extend through the first oxide pattern 122 to connect the first semiconductor pattern 110 and the second semiconductor pattern 126. The second connection pattern 132 may cross/extend through the second oxide pattern 124 to connect the second semiconductor pattern 126 and the third semiconductor pattern 130. The first connection pattern 112 and the second connection pattern 132 may extend in the first direction X.

The first connection pattern 112 and the second connection pattern 132 may include the second semiconductor material. For example, the first connection pattern 112 and the second connection pattern 132 may include at least one of silicon germanium (SiGe), silicon germanium carbide (SiGeC), and germanium (Ge).

In the oxidation process for forming the stress pattern 120, a portion (e.g., a central portion) of a semiconductor layer including silicon germanium (SiGe), silicon germanium carbide (SiGeC), or germanium (Ge) may not be oxidized, thus forming the first connection pattern 112 and the second connection pattern 132.

Figure 8:
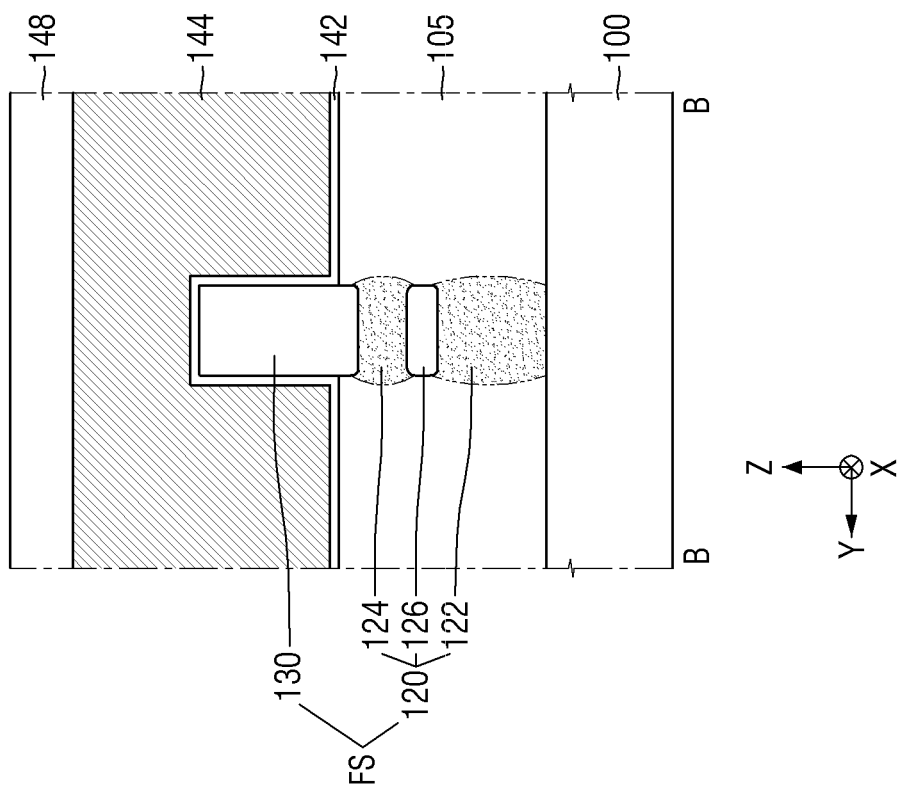

Referring to FIG. 8, in a semiconductor device according to example embodiments, a portion of the stress pattern 120 may directly contact the upper surface of the substrate 100. For example, a lower surface of the first oxide pattern 122 of the stress pattern 120 may directly contact the upper surface of the substrate 100.

In some embodiments, the first semiconductor pattern (see, e.g., 110 of FIG. 3) may be omitted. Thus, a lower surface of the stress pattern 120 may directly contact the upper surface of the substrate 100. For example, a lower surface of the the first oxide pattern 122 of the stress pattern 120 may directly contact the upper surface of the substrate 100.

In some embodiments, as a thickness of the stress pattern 120 is adjusted, the tensile stress applied to the third semiconductor pattern 130 by the stress pattern 120 may be adjusted. Herein, the term "thickness" means a thickness in the third direction Z.

Figure 9:
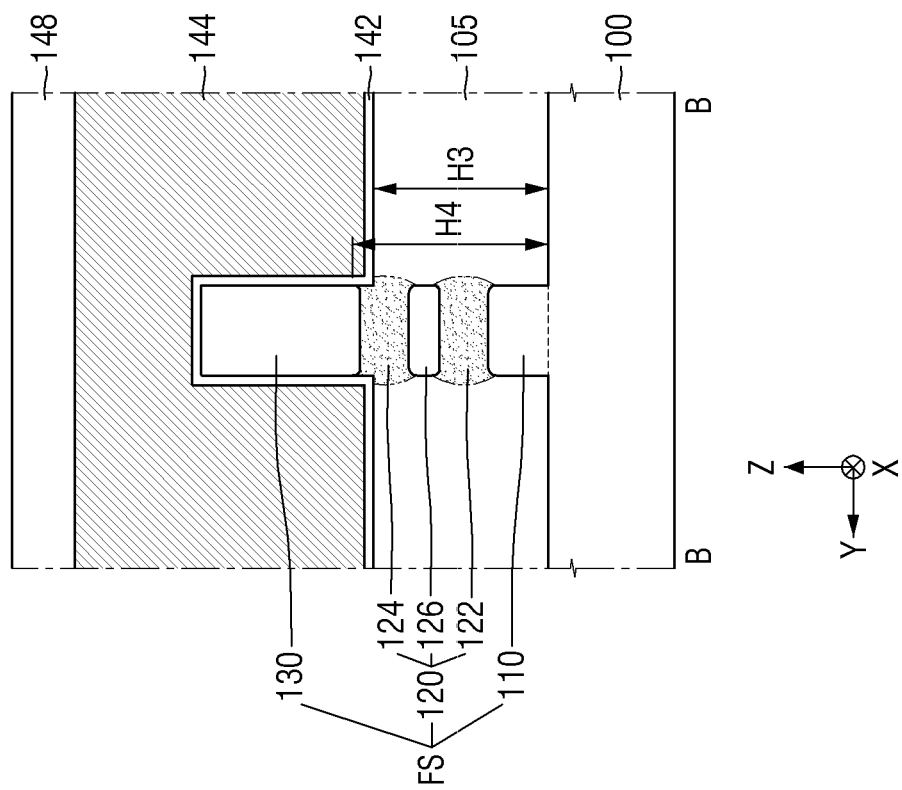

Referring to FIG. 9, in a semiconductor device according to example embodiments, a height H3 of an upper surface of the field insulation layer 105 may be lower than a height H4 of an uppermost surface of the stress pattern 120 with respect to the upper surface of the substrate 100.

The field insulation layer 105 may not vertically overlap (e.g., may expose) at least a portion of the stress pattern 120. In addition, the third semiconductor pattern 130 may not contact the field insulation layer 105.

The height H3 of the upper surface of the field insulation layer 105 may be higher than a height of the upper surface of the second semiconductor pattern 126 with respect to the upper surface of the substrate 100 as shown in FIG. 9, but the inventive concepts are not limited thereto.

In some embodiments, the height H3 of the upper surface of the field insulation layer 105 may be lower than a height of the upper surface of the second semiconductor pattern 126 with respect to the upper surface of the substrate 100. In some embodiments, the height H3 of the upper surface of the field insulation layer 105 may be lower than a height of an upper surface of the first semiconductor pattern 110 with respect to the upper surface of the substrate 100.

Figure 10:
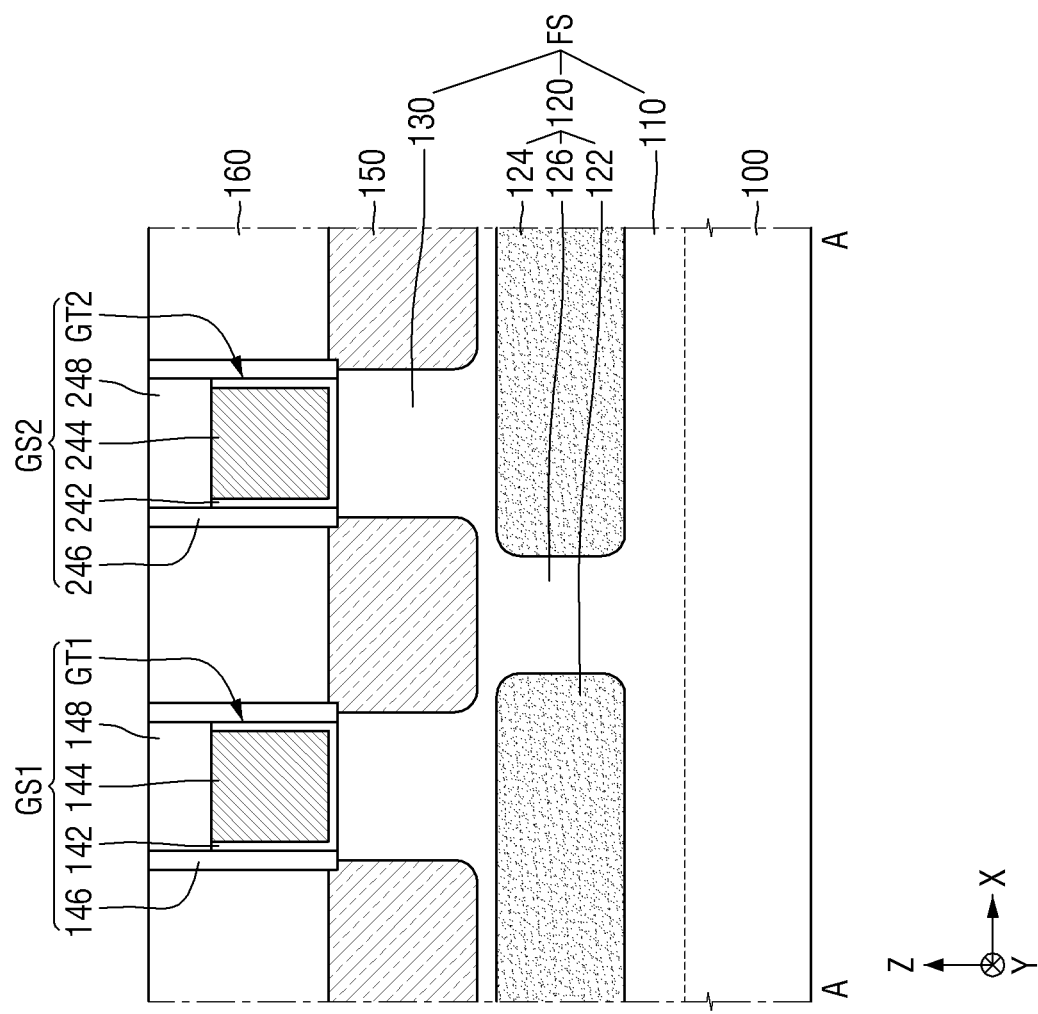
FIGS. 10 and 11 are views illustrating a semiconductor device according to example embodiments.
Figure 11:
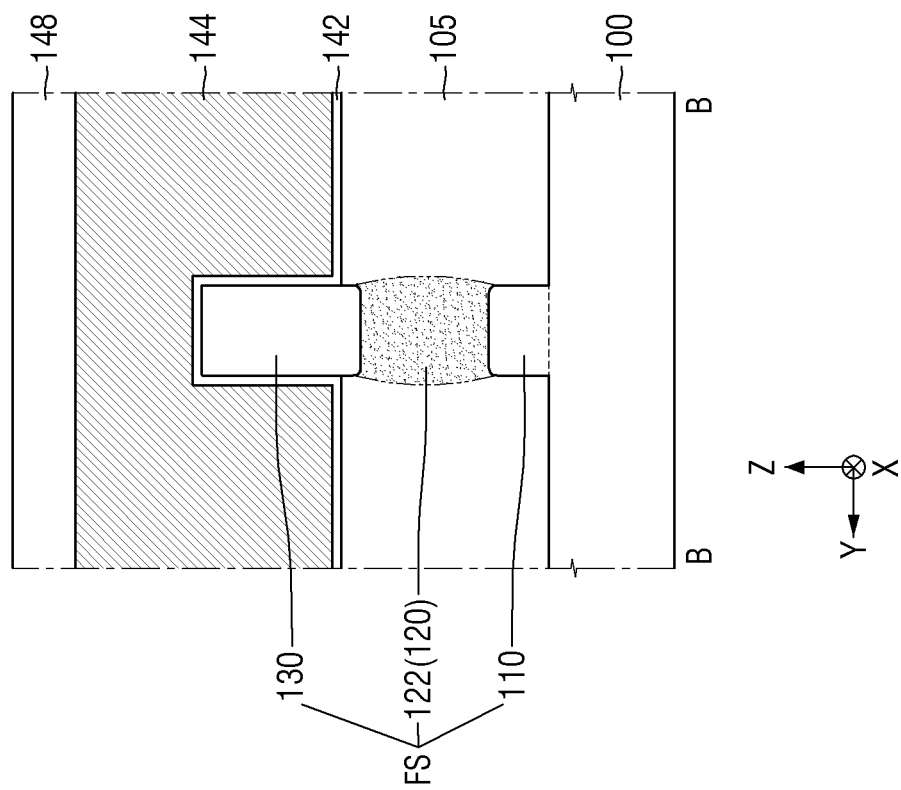
Figure 12:
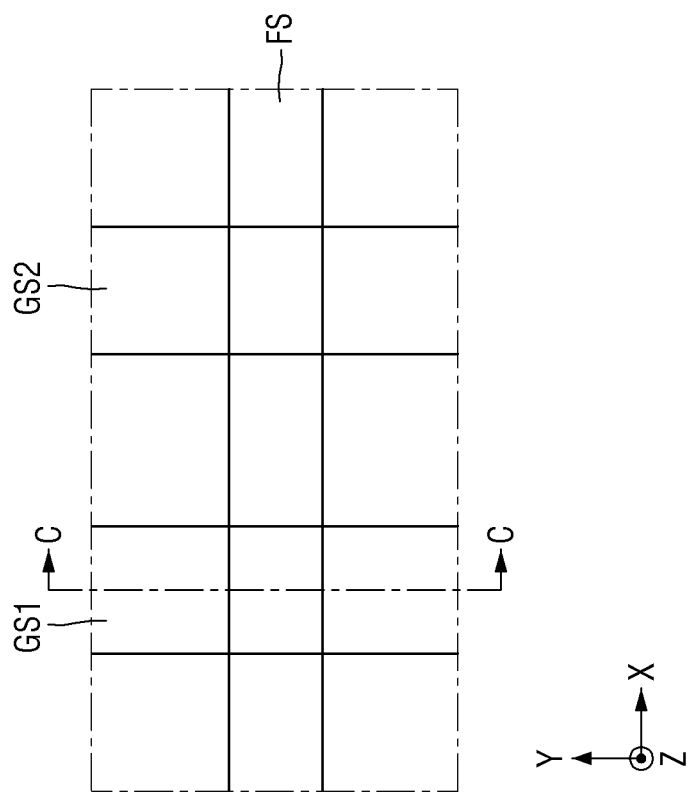
FIGS. 12, 13, and 15 are views illustrating a semiconductor device according to example embodiments.

FIGS. 10 and 11 are cross-sectional views illustrating a semiconductor device according to example embodiments. FIG. 10 is a cross-sectional view taken along line A-A of FIG. 1. FIG. 11 is a cross-sectional view taken along line B-B of FIG. 1. For convenience of explanation, elements duplicated with the examples described above will be described in brief or omitted.

Referring to FIGS. 10 and 11, the first oxide pattern 122 and the second oxide pattern 124 may be spaced apart from each other in the first direction X.

The first direction X may be, for example, a longitudinal extension direction of the first fin structure FS. The first oxide pattern 122, the second semiconductor pattern 126, and the second oxide pattern 124 may be sequentially located (e.g., positioned/arranged) along the first direction X. The first oxide pattern 122 and the second oxide pattern 124 may each extend in the first direction X.

In some embodiments, the first oxide pattern 122 may be overlapped by the first gate electrode 144, and the second oxide pattern 124 may be overlapped by the second gate electrode 244. For example, the first oxide pattern 122 may cross the first gate electrode 144, and the second oxide pattern 124 may cross the second gate electrode 244. Thus, the first oxide pattern 122 may apply the tensile stress to the third semiconductor pattern 130 between the first oxide pattern 122 and the first gate electrode 144. In addition, the second oxide pattern 124 may apply the tensile stress to the third semiconductor pattern 130 between the second oxide pattern 124 and the second gate electrode 244.

In some embodiments, the second semiconductor pattern 126 may not be overlapped by the first gate electrode 144 and the second gate electrode 244.

Figure 13:
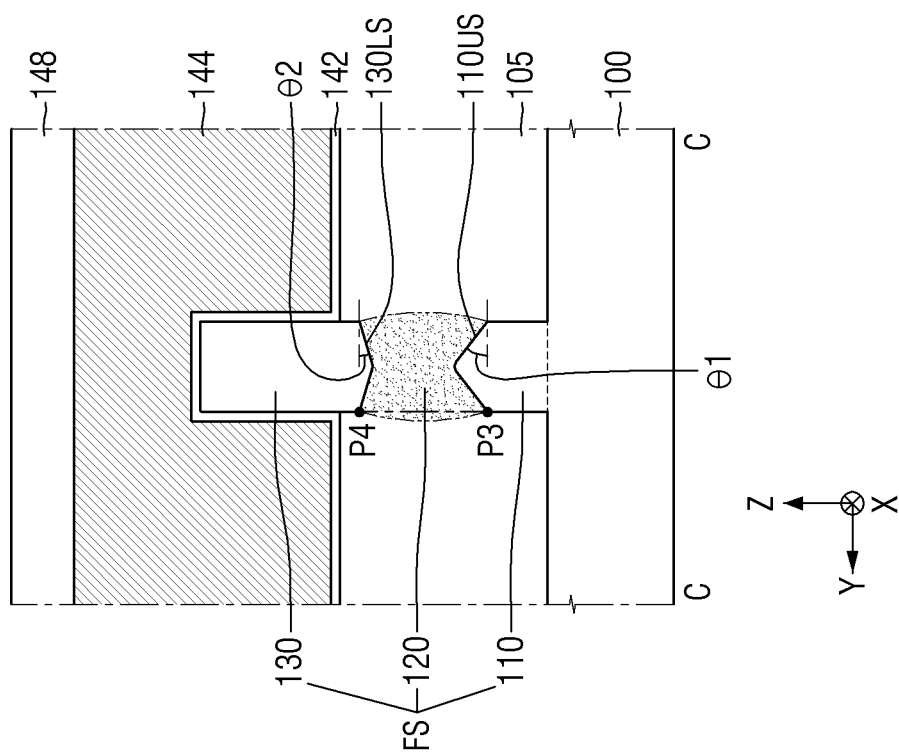
Figure 14:
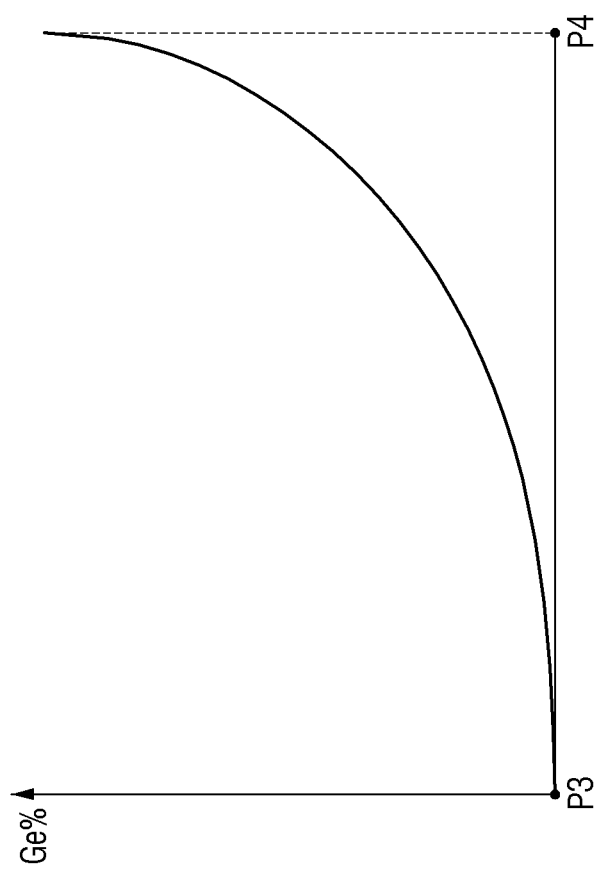
FIG. 14 is a graph illustrating a change in a germanium concentration along a scan line P3-P4 of FIG. 13.
Figure 15:
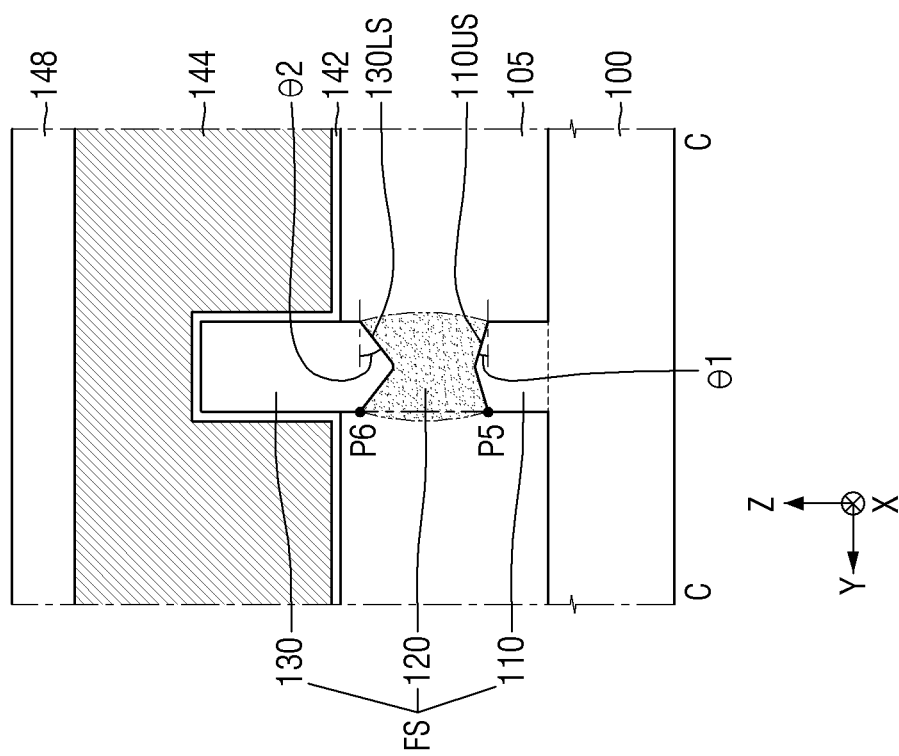
Figure 16:
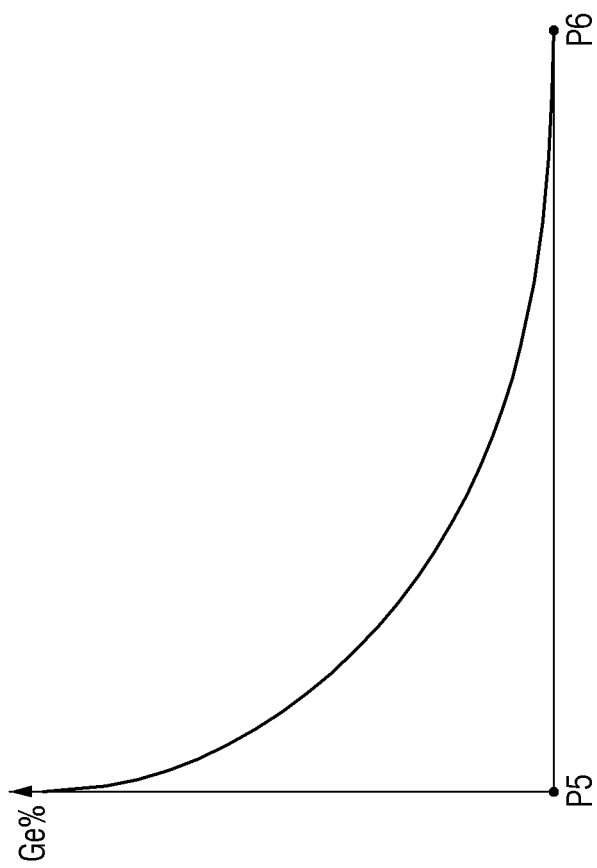
FIG. 16 is a graph illustrating a change in a germanium concentration along a scan line P5-P6 of FIG. 15.

FIGS. 12 to 16 are cross-sectional views illustrating a semiconductor device according to example embodiments. FIGS. 13 and 15 are cross-sectional views taken along line C-C of FIG. 12. FIG. 14 is a graph illustrating a change in a germanium concentration along a second scan line P3-P4 of FIG. 13. FIG. 16 is a graph illustrating a change in a germanium concentration along a second scan line P5-P6 of FIG. 15. For convenience of explanation, elements duplicated with the examples described above will be described in brief or omitted.

Referring to FIGS. 12 to 16, in a semiconductor device according to example embodiments, a first angle θ1 formed between an extension line of an upper surface of the first semiconductor pattern 110 and a line parallel to the upper surface of the substrate 100 may be different from a second angle θ2 formed between an extension line of a lower surface of the third semiconductor pattern 130 and a line parallel to the upper surface of the substrate 100.

In some embodiments, as shown in FIG. 13, the first angle θ1 formed between an extension line of the first surface 110US of the first semiconductor pattern 110 and a line parallel to the upper surface of the substrate 100 may be greater than the second angle θ2 formed between an extension line of the fourth surface 130LS of the third semiconductor pattern 130 and a line parallel to the upper surface of the substrate 100. The second angle θ2 may be an acute angle, but is not limited thereto. For example, the fourth surface 130LS of the third semiconductor pattern 130 may be parallel to the upper surface of the substrate 100.

In this case, a germanium concentration in the stress pattern 120 may increase as a distance from the upper surface of the substrate 100 increases. For example, as shown in FIG. 14, a second scan line P3-P4 crossing the stress pattern 120 in the third direction Z may be defined. The germanium concentration in the stress pattern 120 may increase along the second scan line P3-P4.

As shown in FIG. 14, the germanium concentration in the stress pattern 120 may exponentially increase along the second scan line P3-P4, but the inventive concepts are not limited thereto. For example, the germanium concentration in the stress pattern 120 may linearly increase along the second scan line P3-P4.

In some embodiments, as shown in FIG. 15, the first angle θ1 formed between an extension line of the first surface 110US of the first semiconductor pattern 110 and a line parallel to the upper surface of the substrate 100 may be smaller than the second angle θ2 formed between an extension line of the fourth surface 130LS of the third semiconductor pattern 130 and a line parallel to the upper surface of the substrate 100. The first angle θ1 may be an acute angle, but is not limited thereto. For example, the first surface 110US of the third semiconductor pattern 130 may be parallel to the upper surface of the substrate 100.

In this case, a germanium concentration in the stress pattern 120 may decrease as a distance from the upper surface of the substrate 100 increases. For example, as shown in FIG. 16, a third scan line P5-P6 crossing the stress pattern 120 in the third direction Z may be defined. The germanium concentration in the stress pattern 120 may decrease along the third scan line P5-P6.

As shown in FIG. 16, the germanium concentration in the stress pattern 120 may exponentially decrease along the third scan line P5-P6, but the inventive concepts are not limited thereto. For example, the germanium concentration in the stress pattern 120 may linearly decrease along the third scan line P5-P6.

Figure 17:
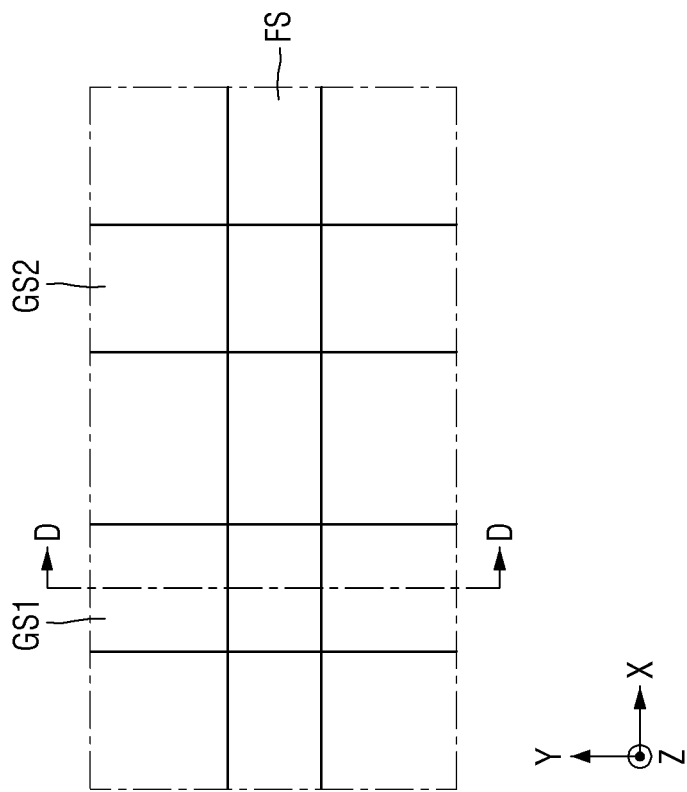
FIGS. 17 to 19 are views illustrating a semiconductor device according to example embodiments.
Figure 18:
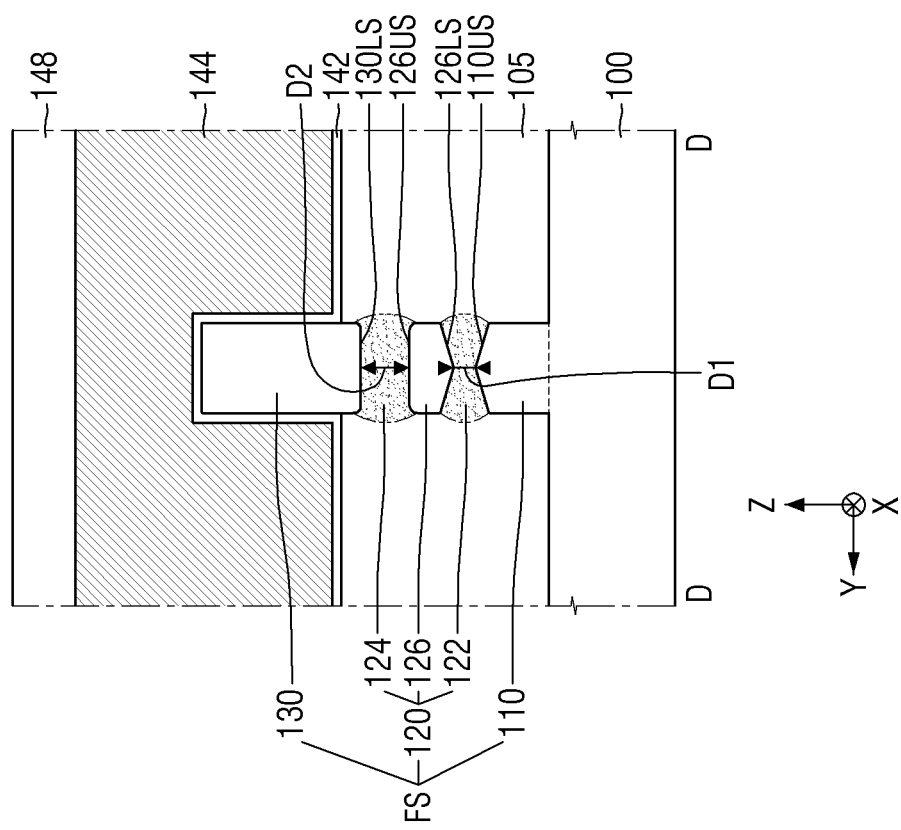
Figure 19:
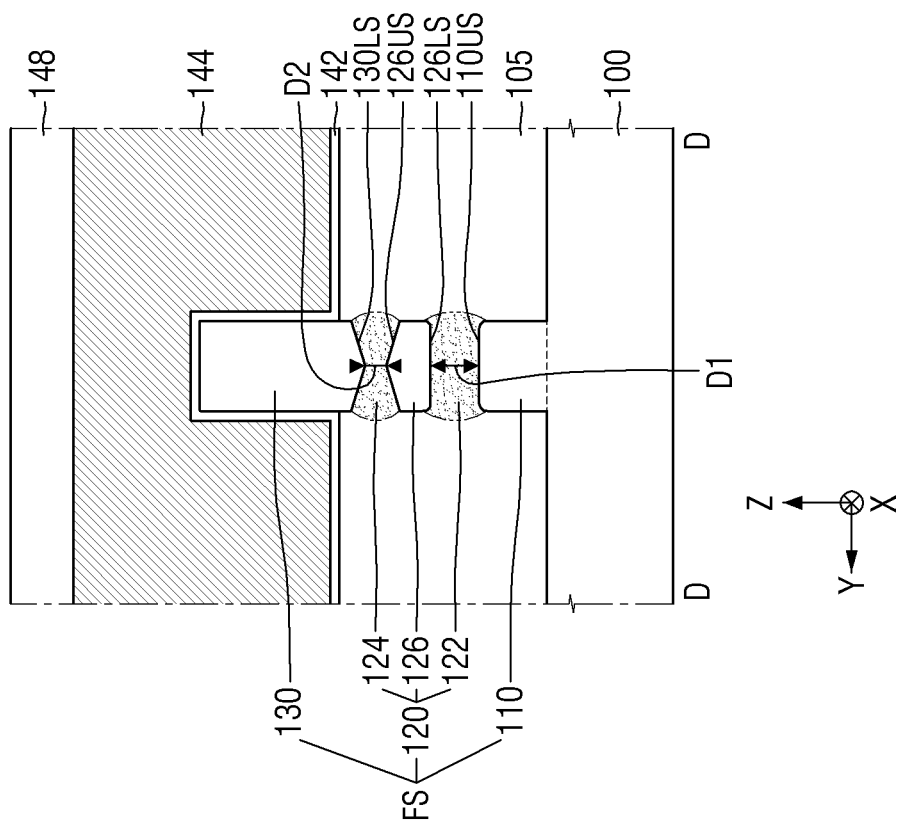

FIGS. 17 to 19 are cross-sectional views illustrating a semiconductor device according to example embodiments. FIGS. 18 and 19 are cross-sectional views taken along line D-D of FIG. 17. For convenience of explanation, elements duplicated with the examples described above will be described in brief or omitted.

Referring to FIGS. 17 to 19, in a semiconductor device according to example embodiments, an angle formed between an extension line of a lower surface of the second semiconductor pattern 126 and a line parallel to the upper surface of the substrate 100 may be different from an angle formed between an extension line of an upper surface of the second semiconductor pattern 126 and a line parallel to the upper surface of the substrate 100.

In some embodiments, as shown in FIG. 18, an angle formed between an extension line of the second surface 126LS of the second semiconductor pattern 126 and a line parallel to the upper surface of the substrate 100 may be greater than an angle formed between an extension line of the third surface 126US of the second semiconductor pattern 126 and a line parallel to the upper surface of the substrate 100. In this case, a germanium concentration in the first oxide pattern 122 may be lower than a germanium concentration in the second oxide pattern 124. The third surface 126US of the second semiconductor pattern 126 may be parallel to the upper surface of the substrate 100. In some embodiments, the third surface 126US of the second semiconductor pattern 126 may be sloped at an acute angle with respect to the upper surface of the substrate 100.

In this case, in some embodiments, a shortest (e.g., minimum) distance D1 between the first semiconductor pattern 110 and the second semiconductor pattern 126 may be smaller than a shortest (e.g., minimum) distance D2 between the second semiconductor pattern 126 and the third semiconductor pattern 130.

In some embodiments, as shown in FIG. 19, an angle formed between an extension line of the second surface 126LS of the second semiconductor pattern 126 and a line parallel to the upper surface of the substrate 100 may be smaller than an angle formed between an extension line of the third surface 126US of the second semiconductor pattern 126 and a line parallel to the upper surface of the substrate 100. In this case, a germanium concentration in the first oxide pattern 122 may be greater than a germanium concentration in the second oxide pattern 124. The third surface 126US of the second semiconductor pattern 126 may be parallel to the upper surface of the substrate 100. In some embodiments, the third surface 126US of the second semiconductor pattern 126 may be sloped at an acute angle with respect to the upper surface of the substrate 100.

In this case, in some embodiments, a shortest (e.g., minimum) distance D1 between the first semiconductor pattern 110 and the second semiconductor pattern 126 may be greater than a shortest (e.g., minimum) distance D2 between the second semiconductor pattern 126 and the third semiconductor pattern 130.

In some embodiments, an angle formed between an extension line of the first surface 110US of the first semiconductor pattern 110 and a line parallel to the upper surface of the substrate 100 may be substantially the same as an angle formed between an extension line of the second surface 126LS of the second semiconductor pattern 126 and a line parallel to the upper surface of the substrate 100. Thus, a profile of the first surface 110US of the first semiconductor pattern 110 and a profile of the second surface 126LS of the second semiconductor pattern 126 may be symmetrical to each other with respect to the first oxide pattern 122.

In some embodiments, an angle formed between an extension line of the fourth surface 130LS of the third semiconductor pattern 130 and a line parallel to the upper surface of the substrate 100 may be substantially the same as an angle formed between an extension line of the third surface 126US of the second semiconductor pattern 126 and a line parallel to the upper surface of the substrate 100. Thus, a profile of the third surface 126US of the second semiconductor pattern 126 and a profile of the fourth surface 130LS of the third semiconductor pattern 130 may be symmetrical to each other with respect to the second oxide pattern 124.

Figure 20:
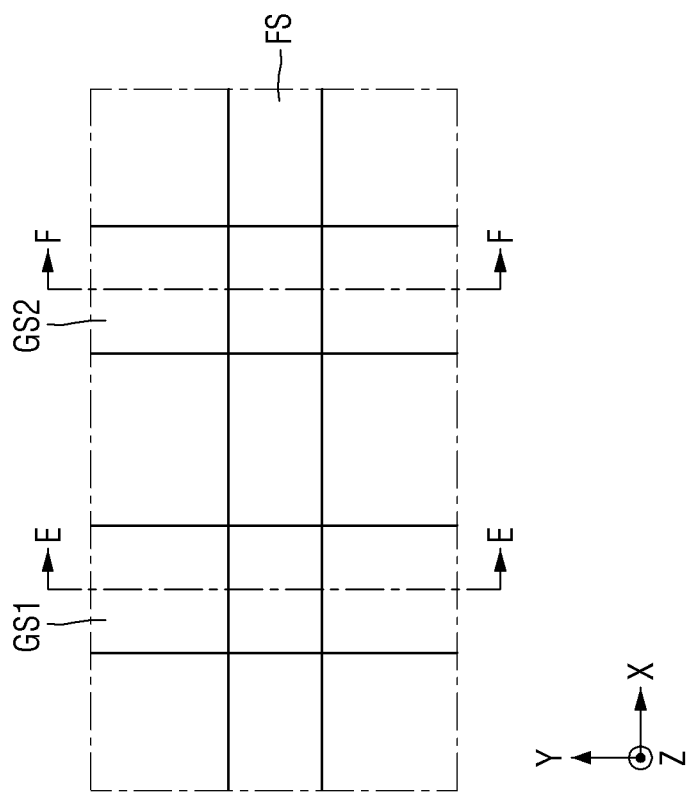
FIGS. 20 to 22 are views illustrating a semiconductor device according to example embodiments.
Figure 21:
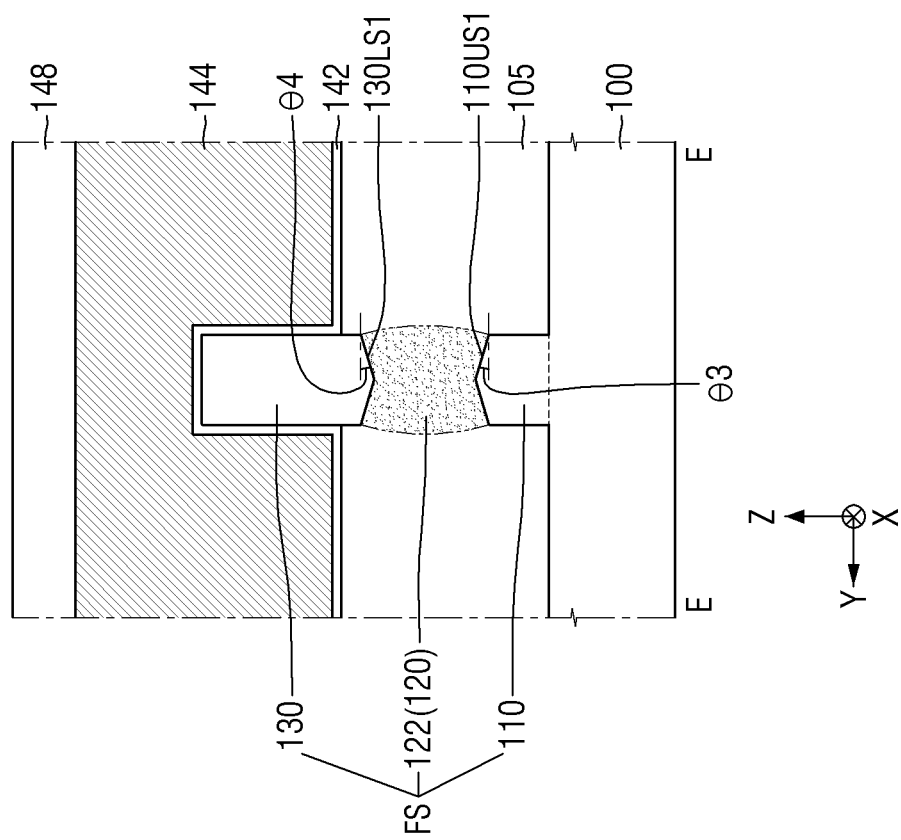
Figure 22:
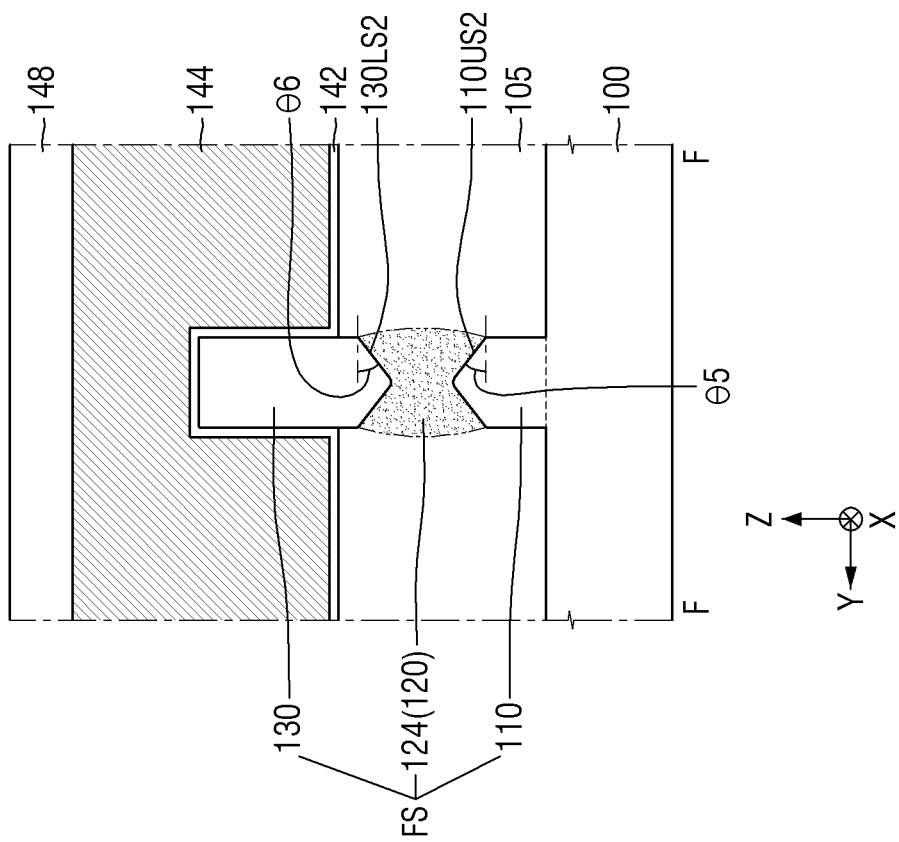
Figure 23:
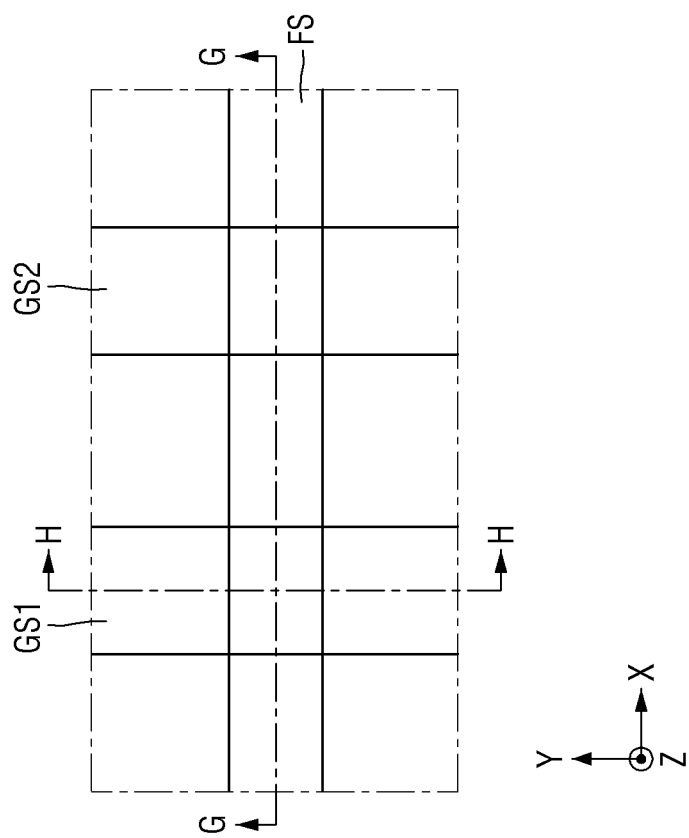
FIGS. 23 to 27 are views illustrating a semiconductor device according to example embodiments.

FIGS. 20 to 22 are cross-sectional views illustrating a semiconductor device according to example embodiments. FIG. 21 is a cross-sectional view taken along line E-E of FIG. 20. FIG. 22 is a cross-sectional view taken along line F-F of FIG. 20. For convenience of explanation, elements duplicated with the examples described above will be described in brief or omitted.

Referring to FIGS. 20 to 22, in a semiconductor device according to example embodiments, the first oxide pattern 122 and the second oxide pattern 124 may be sequentially arranged in the first direction X. An angle formed between an extension line of each of an upper surface and a lower surface of the first oxide pattern 122 and a line parallel to the upper surface of the substrate 100 may be different from an angle formed between an extension line of each of an upper surface and a lower surface of the second oxide pattern 124 and a line parallel to the upper surface of the substrate 100.

For example, an upper surface of the first semiconductor pattern 110 contacting the first oxide pattern 122 may include a fifth surface 110US1. A lower surface of the third semiconductor pattern 130 contacting the first oxide pattern 122 may include a sixth surface 130LS1. The upper surface of the first semiconductor pattern 110 contacting the second oxide pattern 124 may have a seventh surface 110US2. The lower surface of the third semiconductor pattern 130 contacting the second oxide pattern 124 may include an eighth surface 130LS2.

A third angle θ3 formed between an extension line of the fifth surface 110US1 of the first semiconductor pattern 110 and a line parallel to the upper surface of the substrate 100 may be smaller than a fifth angle θ5 formed between an extension line of the seventh surface 110US2 of the first semiconductor pattern 110 and a line parallel to the upper surface of the substrate 100. A fourth angle θ4 formed between an extension line of the sixth surface 130LS1 of the third semiconductor pattern 130 and a line parallel to the upper surface of the substrate 100 may be smaller than a sixth angle θ6 formed between an extension line of the eighth surface 130LS2 of the third semiconductor pattern 130 and a line parallel to the upper surface of the substrate 100.

In this case, a first germanium concentration in the first oxide pattern 122 may be greater than a second germanium concentration in the second oxide pattern 124. In some embodiments, as shown in the drawings, the fifth surface 110US1 of the first semiconductor pattern 110 and the sixth surface 130LS1 of the third semiconductor pattern 130 may be sloped at an acute angle with respect to the upper surface of the substrate 100. In some embodiments, the fifth surface 110US1 of the first semiconductor pattern 110 and the sixth surface 130LS1 of the third semiconductor pattern 130 may be parallel to the upper surface of the substrate 100.

In some embodiments, the third angle θ3 may be substantially the same as the fourth angle θ4. A profile of the fifth surface 110US1 of the first semiconductor pattern 110 and the sixth surface 130LS1 of the third semiconductor pattern 130 may be symmetrical to each other with respect to the first oxide pattern 122. In some embodiments, the fifth angle θ5 may be substantially the same as the sixth angle θ6. A profile of the seventh surface 110US2 of the first semiconductor pattern 110 and the eighth surface 130LS2 of the third semiconductor pattern 130 may be symmetrical to each other with respect to the second oxide pattern 124.

In some embodiments, as the first germanium concentration in the first oxide pattern 122 and the second germanium concentration in the second oxide pattern 124 are adjusted, the tensile stress applied to the third semiconductor pattern 130 may be adjusted. For example, the tensile stress applied to a portion of the third semiconductor pattern 130 between the first gate electrode 144 and the stress pattern 120 and the tensile stress applied to a portion of the third semiconductor pattern 130 between the second gate electrode 244 and the stress pattern 120 may be separately adjusted.

Figure 24:
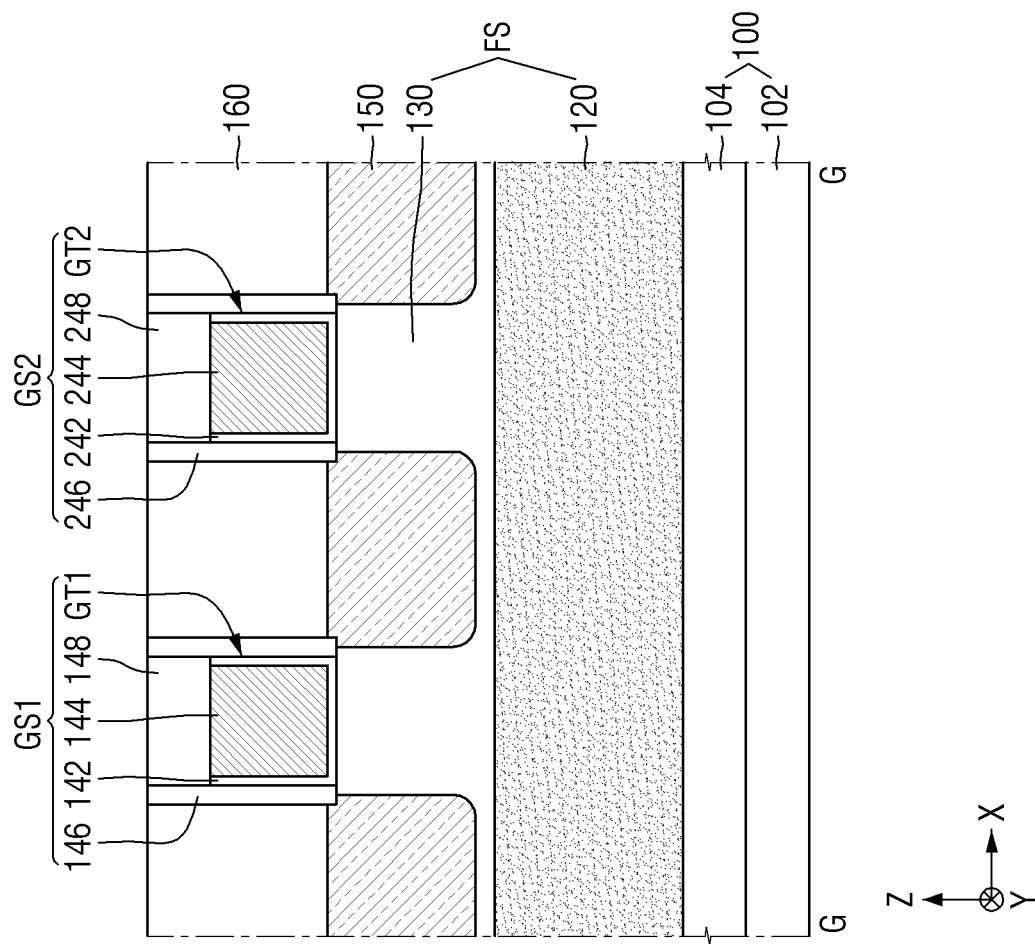
Figure 25:
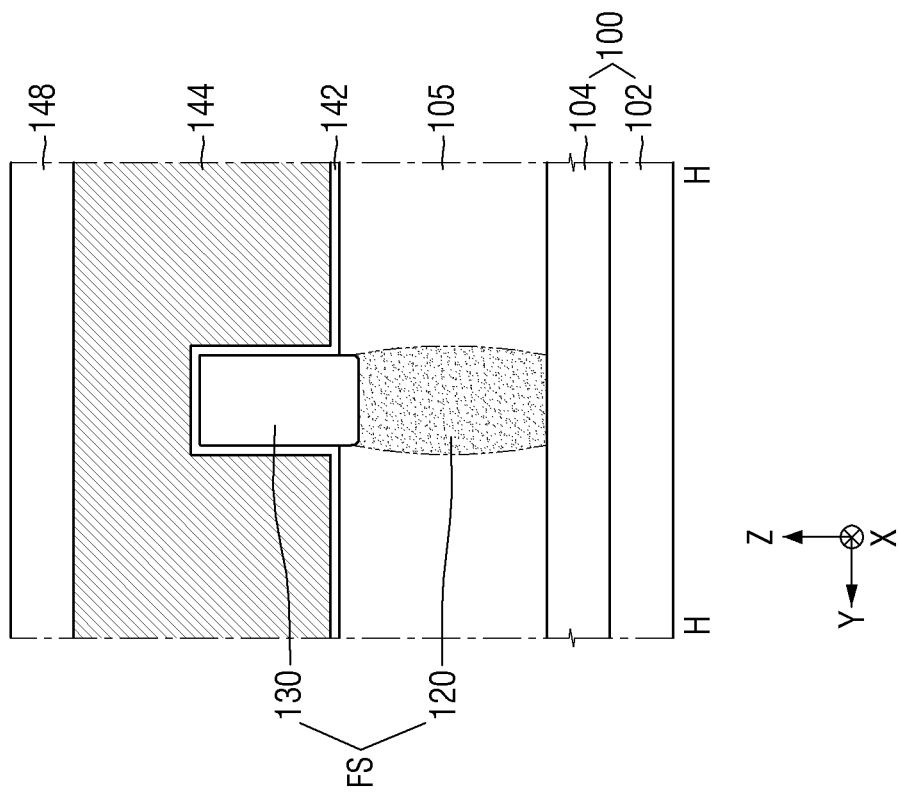
Figure 26:
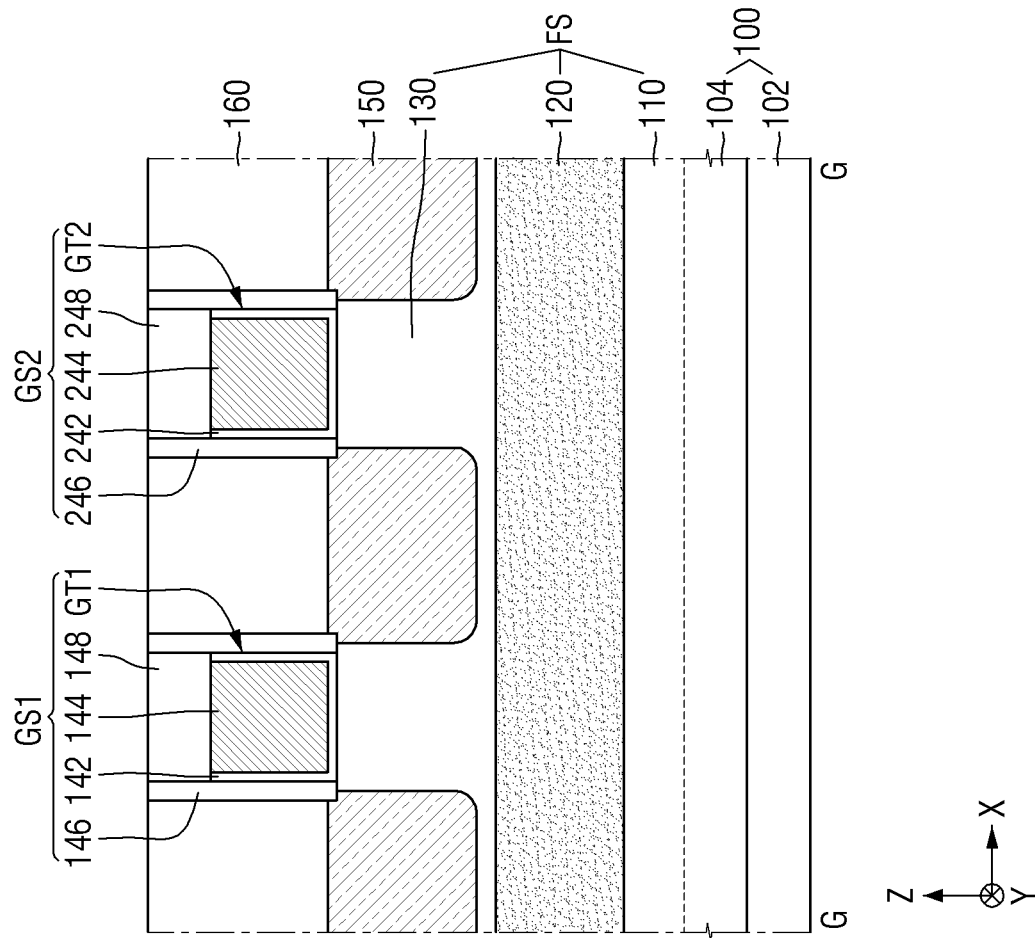
Figure 27:
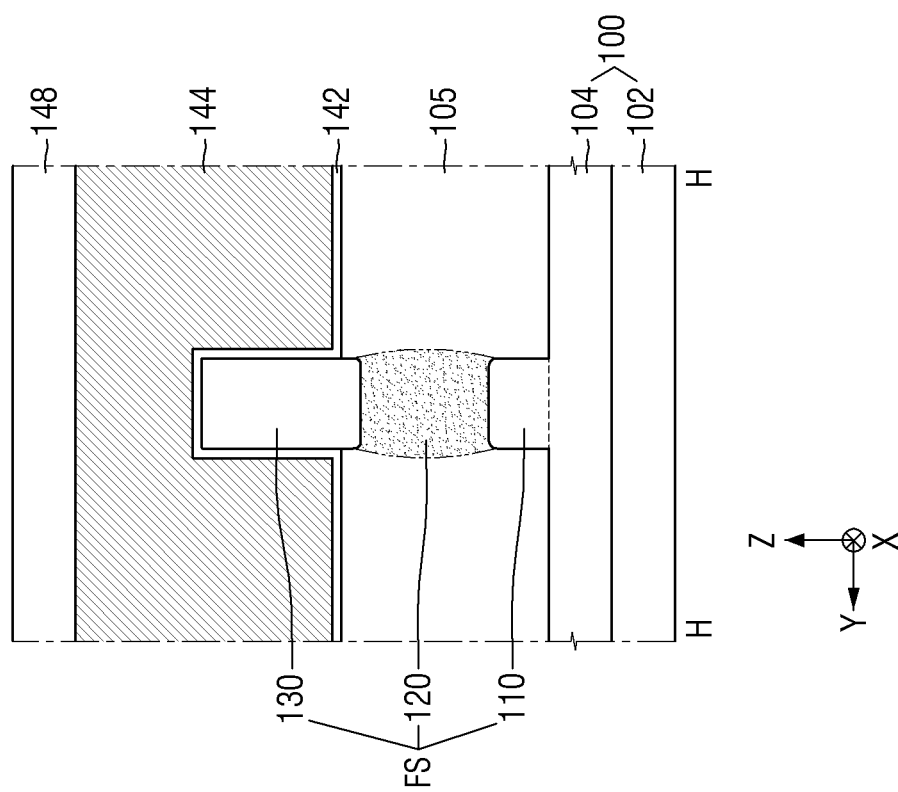

FIGS. 23 to 27 are cross-sectional views illustrating a semiconductor device according to example embodiments. FIGS. 24 and 26 are cross-sectional views taken along line G-G of FIG. 23. FIGS. 25 and 27 are cross-sectional views taken along line H-H of FIG. 23. For convenience of explanation, elements duplicated with the examples described above will be described in brief or omitted.

Referring to FIGS. 23 to 27, in a semiconductor device, the substrate 100 may include a base substrate 102 and a buried insulation layer (BOX) 104. The fin structure FS may directly contact an upper surface of the buried insulation layer 104.

The base substrate 102 may include a semiconductor material. The base substrate 102 may be, for example, a silicon substrate, but is not limited thereto.

The buried insulation layer 104 may be formed on the base substrate 102. The buried insulation layer 104 may include, for example, silicon oxide, but is not limited thereto.

In some embodiments, as shown in FIGS. 24 and 25, the first semiconductor pattern (see, e.g., 110 of FIG. 2) in the first fin structure FS may be omitted. Thus, a lower surface of the stress pattern 120 may directly contact an upper surface of the buried insulation layer 104.

In some embodiments, as shown in FIGS. 26 and 27, the first semiconductor pattern 110 of the first fin structure FS may directly contact the upper surface of the buried insulation layer 104.

In some embodiments, the stress pattern 120 may include the first oxide pattern 122, the second semiconductor pattern 126, and the second oxide pattern 124 as described in the above examples.

Figure 28:
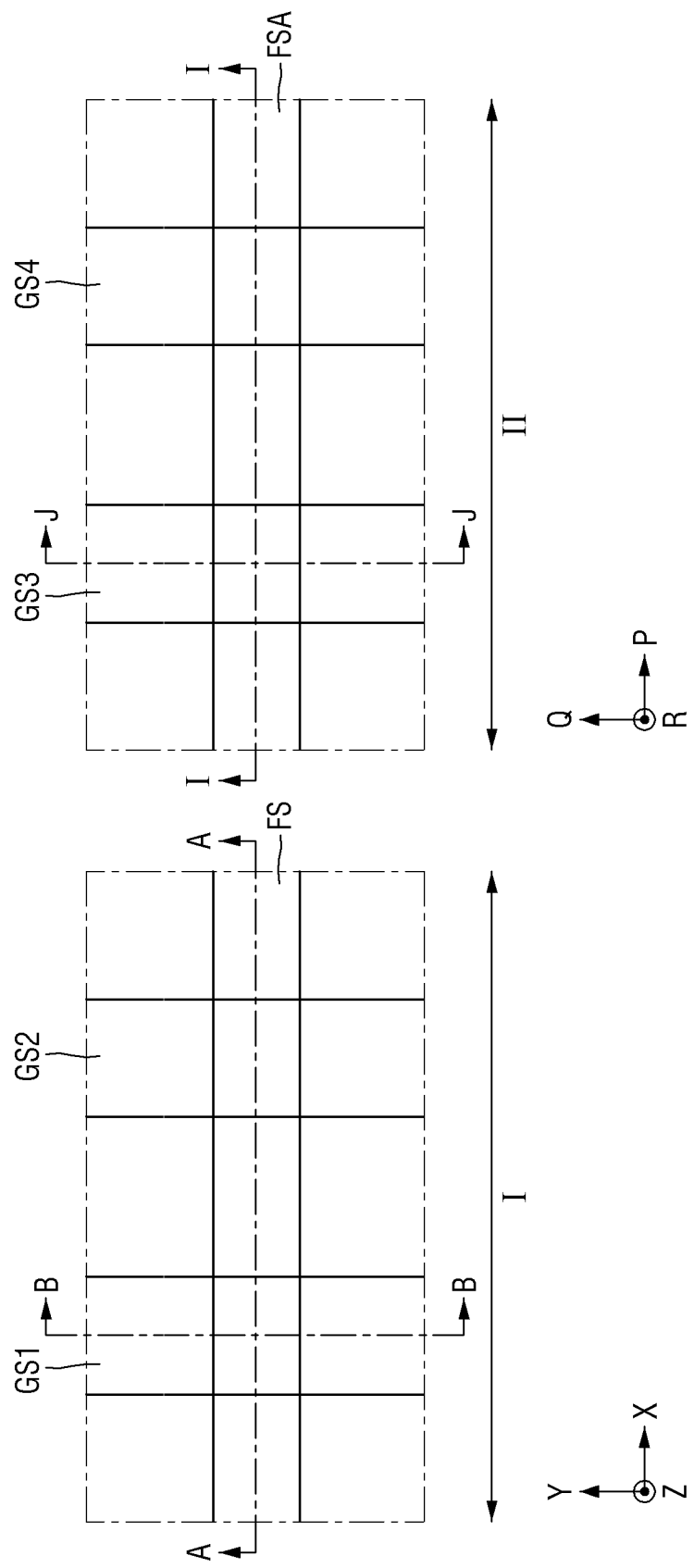
FIGS. 28 to 30 are views illustrating a semiconductor device according to example embodiments.
Figure 29:
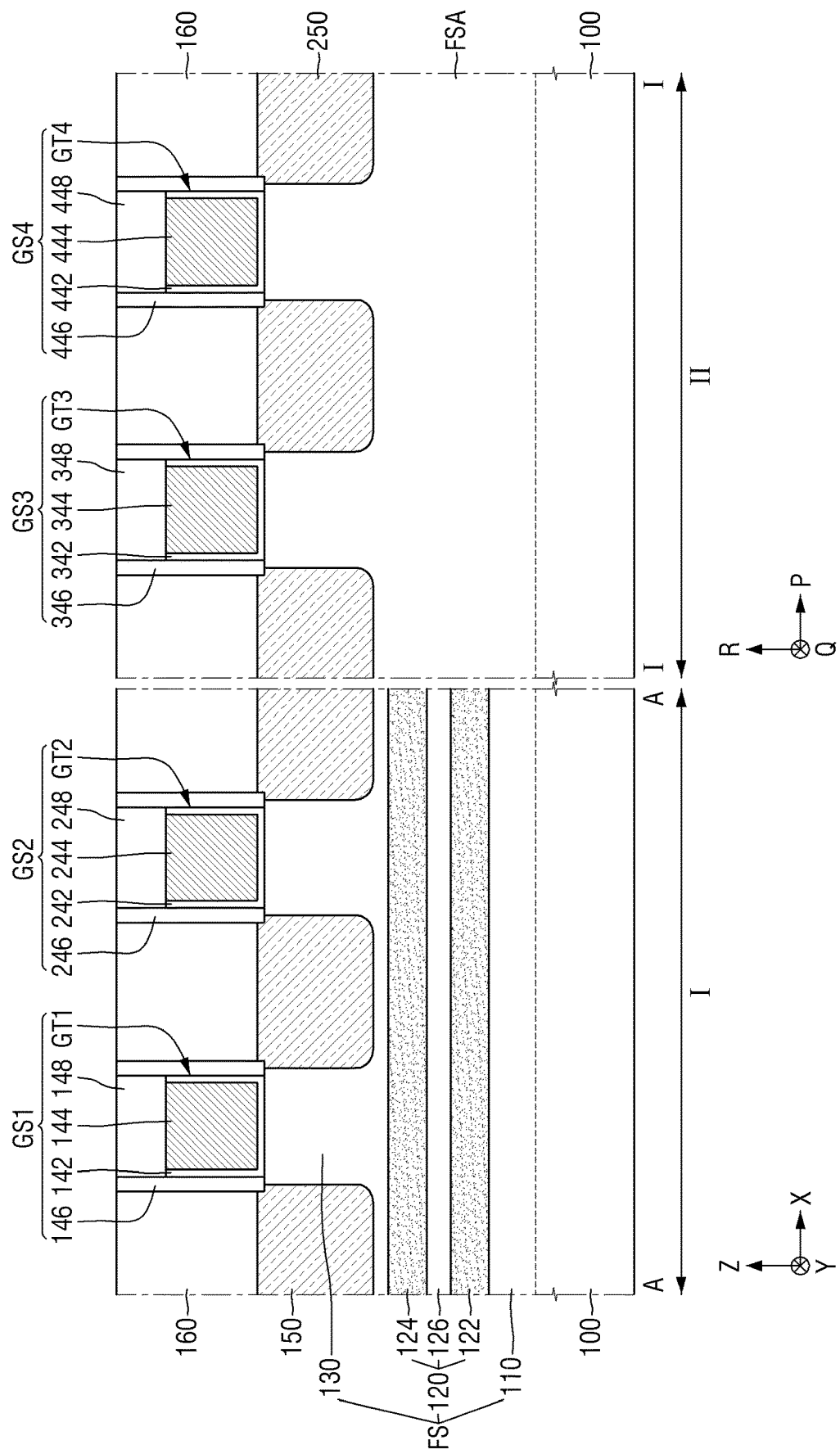
Figure 30:
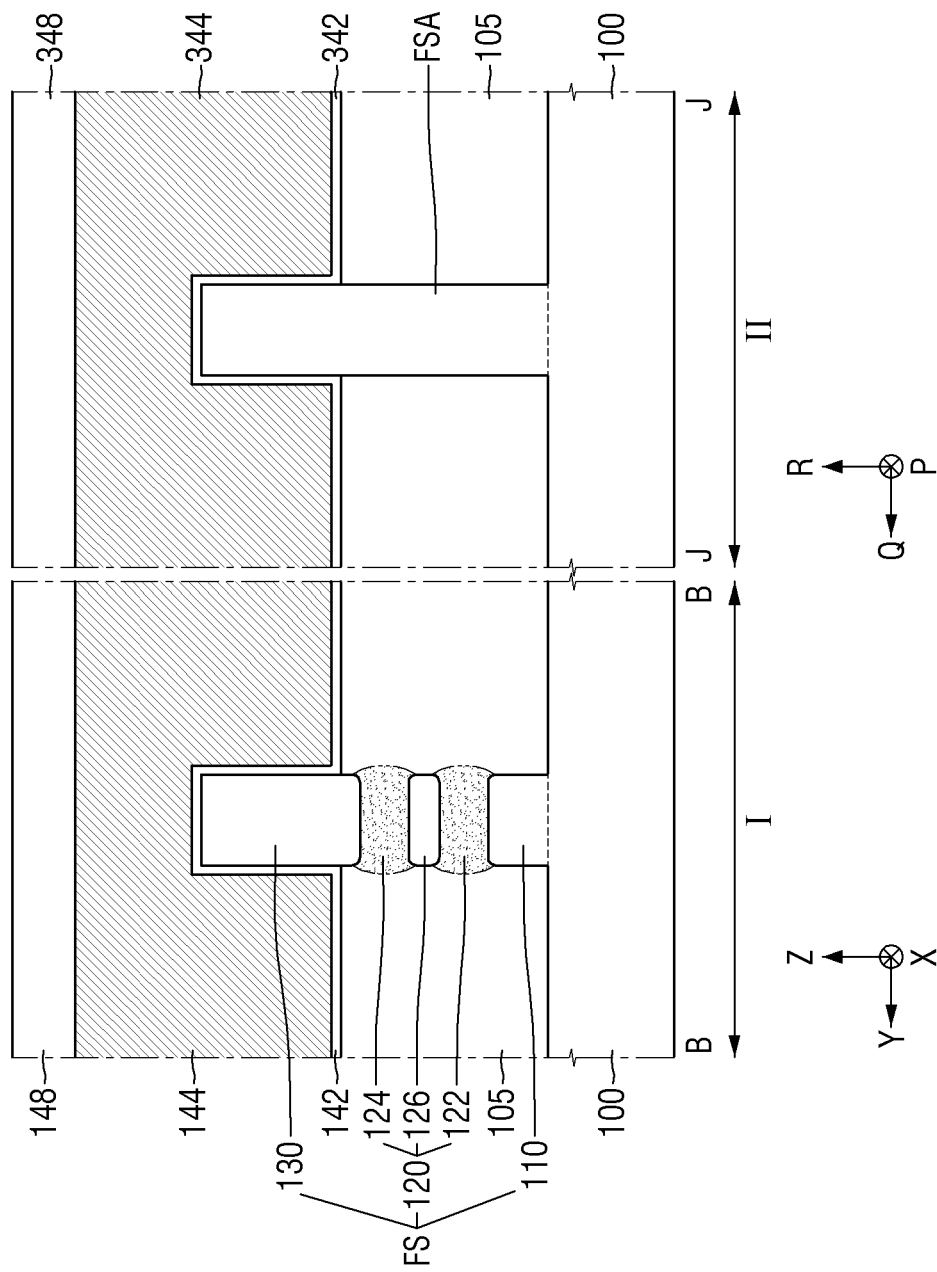

FIGS. 28 to 30 are cross-sectional views illustrating a semiconductor device according to example embodiments. FIG. 29 is a cross-sectional view taken along line I-I of FIG. 28. FIG. 30 is a cross-sectional view taken along line J-J of FIG. 28. For convenience of explanation, elements duplicated with the examples described above will be described in brief or omitted.

Referring to FIGS. 28 to 30, in a semiconductor device according to example embodiments, the substrate 100 may include a first region I and a second region II. The first region I and the second region II may be spaced apart from each other or may be connected to each other.

The first region I and the second region II may be one of a logic region, an SRAM region, and an input/output region. The first region I and the second region II may be regions in which same functions may be performed or may be regions in which different functions may be performed.

As an example, a semiconductor device formed in the first region I may be the semiconductor device described with reference to FIGS. 1 to 5. In some embodiments, a semiconductor device formed in the first region I may be any of the semiconductor devices described with reference to FIGS. 6 to 27.

A semiconductor device formed in the second region II of the substrate 100 may include a second fin structure FSA, a third gate structure GS3, and a fourth gate structure GS4.

The second fin structure FSA may protrude from the substrate 100. The second fin structure FSA may extend in a fourth direction P parallel to an upper surface of the substrate 100. The second fin structure FSA may be a portion of the substrate 100 or may include an epitaxial layer grown from the substrate 100.

The second fin structure FSA may include a semiconductor material, for example, silicon or germanium. In some embodiments, the second fin structure FSA may include a compound semiconductor, for example, a group IV-IV compound semiconductor or a group III-III compound semiconductor. In some embodiments, the second fin structure FSA may include substantially the same material as the first semiconductor pattern 110.

The third gate structure GS3 and the fourth gate structure GS4 may be formed on the second fin structure FSA and the field insulation layer 105. The third gate structure GS3 and the fourth gate structure GS4 may cross the second fin structure FSA. For example, the third gate structure GS3 and the fourth gate structure GS4 may be spaced apart from each other in the fourth direction P and may extend in a fifth direction Q parallel to the upper surface of the substrate 100 and crossing the fourth direction P.

The third gate structure GS3 may include a third gate insulation layer 342, a third gate electrode 344, third gate spacers 346, a third gate trench GT3 defined by the third gate spacers 346, and a third capping pattern 348.

The fourth gate structure GS4 may include a fourth gate insulation layer 442, a fourth gate electrode 444, fourth gate spacers 446, a fourth gate trench GT4 defined by the fourth gate spacers 446, and a fourth capping pattern 448.

In some embodiments, transistors of different types may be formed in the first region I and the second region II, respectively. For example, a semiconductor device formed in the first region I may be an NMOS transistor, and a semiconductor device formed in the second region II may be a PMOS transistor. Alternatively, a semiconductor device formed in the first region I may be a PMOS transistor, and a semiconductor device formed in the second region II may be an NMOS transistor. In some embodiments, a transistor of the same type may be formed in each of the first region I and the second region II.

Figure 31:
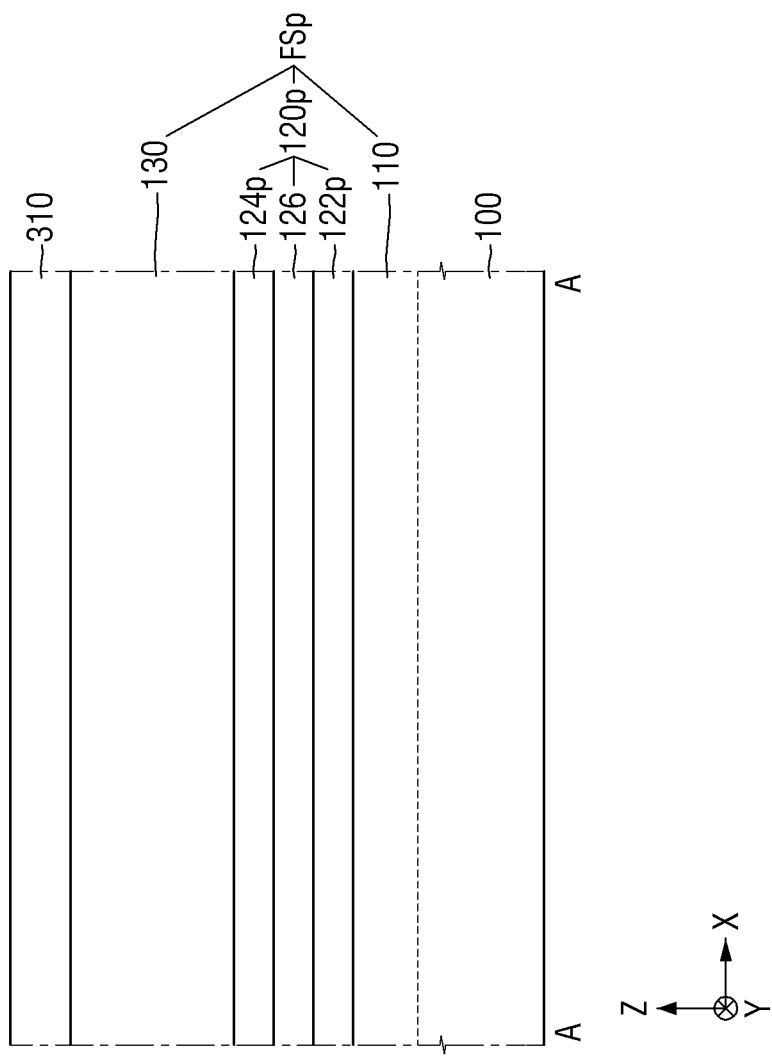
FIGS. 31 to 37 are views illustrating stages in a method of fabricating a semiconductor device according to example embodiments.
Figure 32:
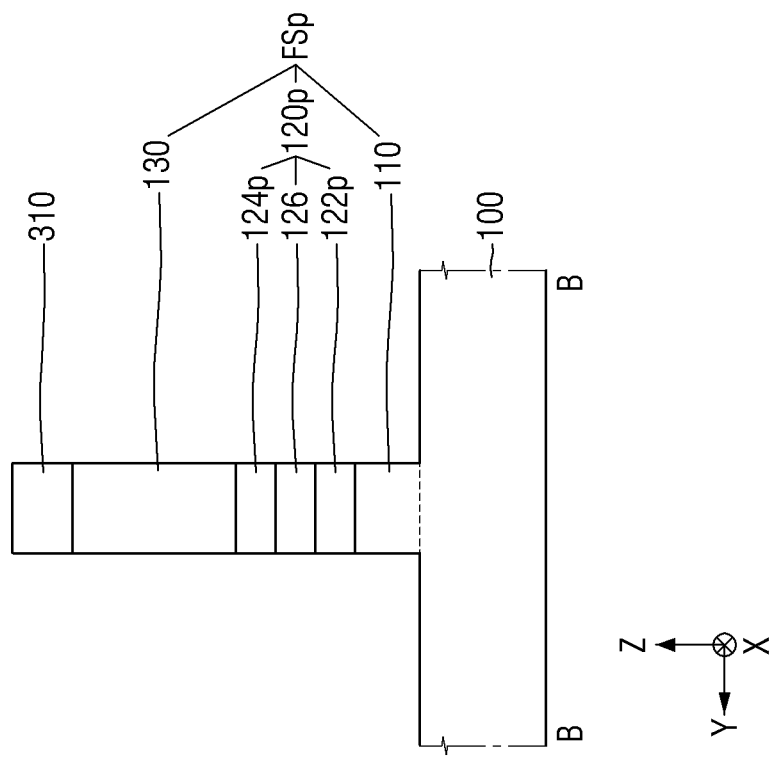
Figure 33:
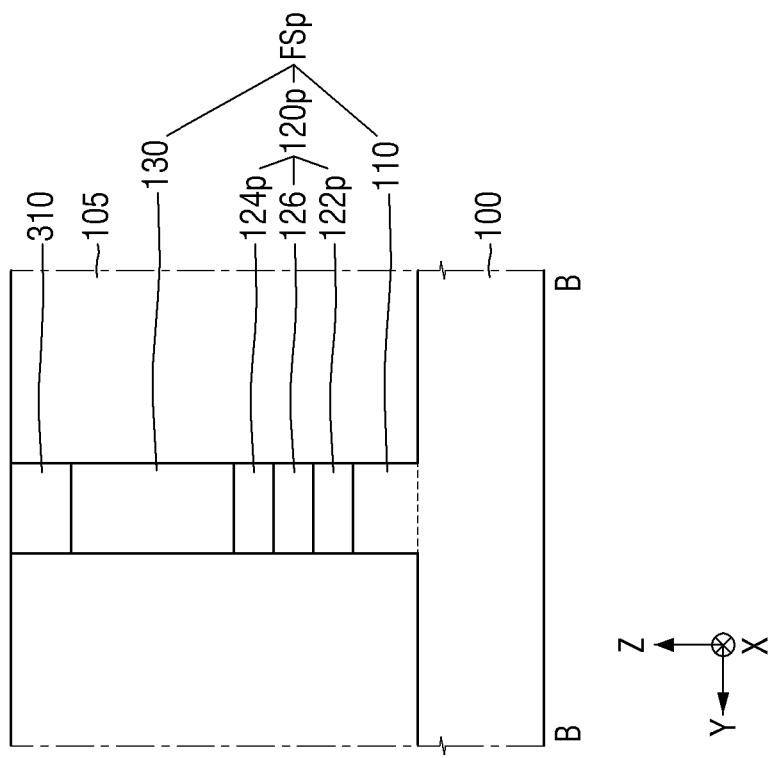
Figure 34:
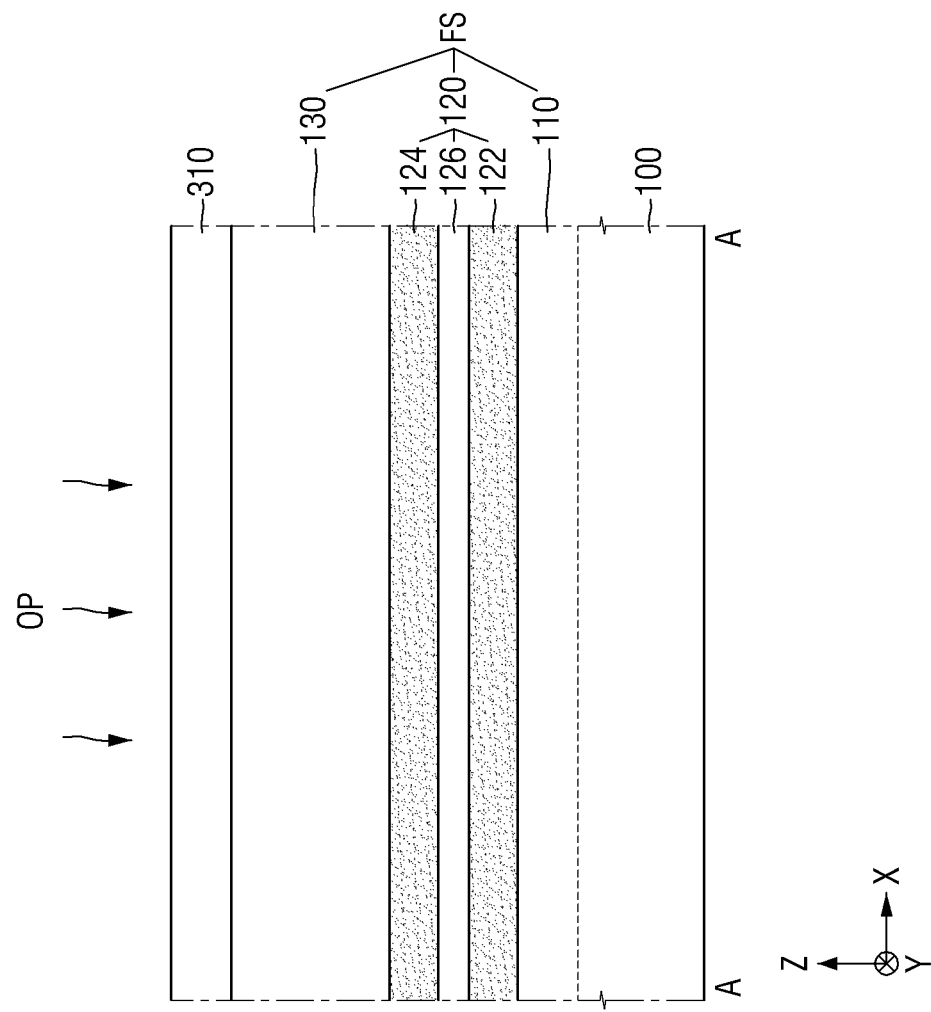
Figure 35:
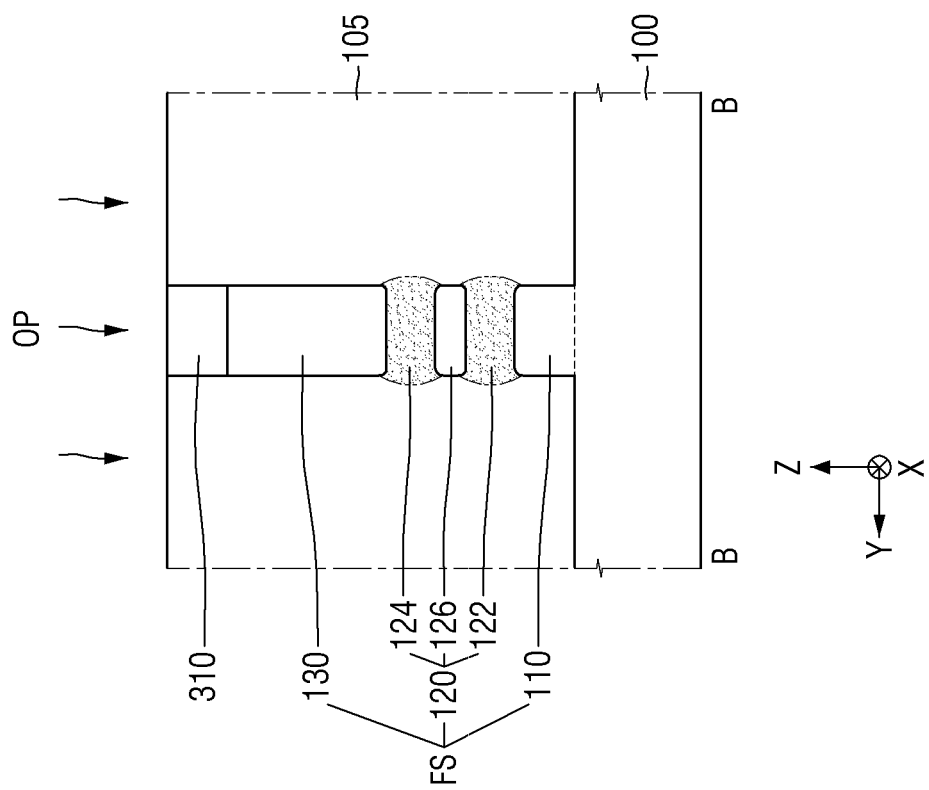
Figure 36:
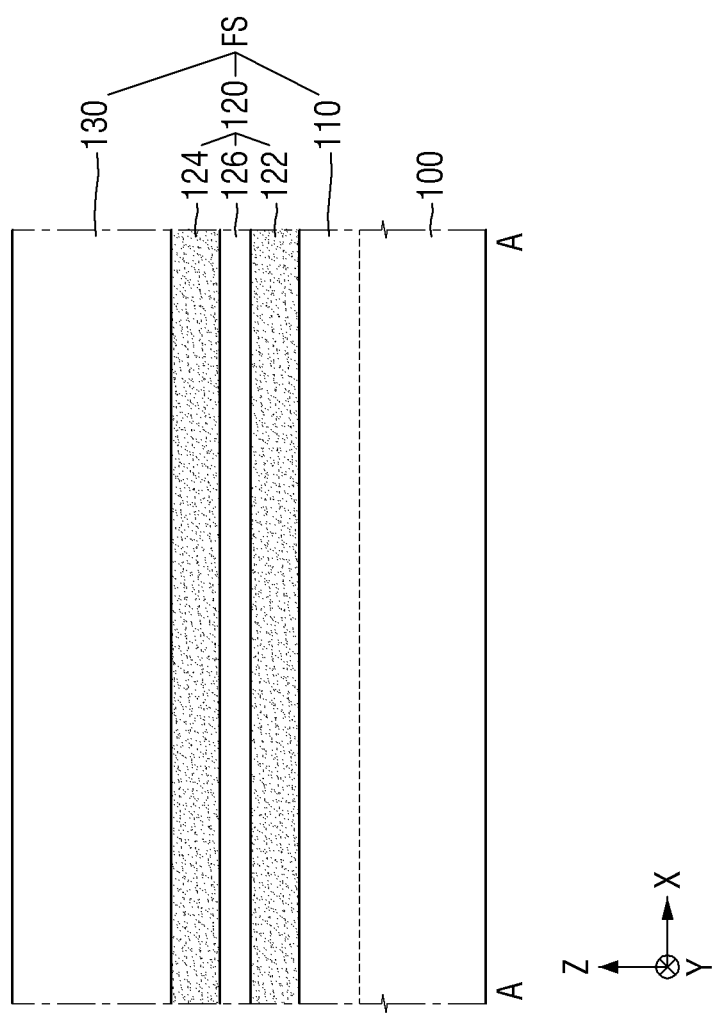

FIGS. 31 to 37 are views illustrating stages in a method of fabricating a semiconductor device according to example embodiments. FIGS. 31, 34 and 36 are cross-sectional views taken along line A-A' of FIG. 1. FIGS. 32, 33, 35, and 37 are cross-sectional views taken along line B-B' of FIG. 1. For convenience of explanation, elements duplicated with the examples described above will be described in brief or omitted.

Referring to FIGS. 31 and 32, a preliminary semiconductor pattern FSp including the first semiconductor pattern 110, a preliminary stress pattern 120p, and the third semiconductor pattern 130 may be formed on the substrate 100.

The first semiconductor pattern 110, the preliminary stress pattern 120p, and the third semiconductor pattern 130 may be sequentially stacked on the substrate 100. In addition, the first semiconductor pattern 110, the preliminary stress pattern 120p, and the third semiconductor pattern 130 may extend in the first direction X.

The first semiconductor pattern 110 may include a first semiconductor material, for example, silicon (Si).

The preliminary stress pattern 120p may include a second semiconductor material, for example, a semiconductor material having an oxidation rate faster than that of the first semiconductor material. For example, the preliminary stress pattern 120p may include one of silicon-germanium oxide, silicon-germanium-carbide oxide, and germanium oxide.

The preliminary stress pattern 120p may include the second semiconductor pattern 126, a fourth semiconductor pattern 122p, and a fifth semiconductor pattern 124p. The second semiconductor pattern 126 may be interposed between the fourth semiconductor pattern 122p and the fifth semiconductor pattern 124p.

In some embodiments, the fourth semiconductor pattern 122p, the second semiconductor pattern 126, and the fifth semiconductor pattern 124p may be sequentially stacked on the substrate 100. The second semiconductor pattern 126, the fourth semiconductor pattern 122p, and the fifth semiconductor pattern 124p may extend in the first direction X.

The fourth semiconductor pattern 122p and the fifth semiconductor pattern 124p may include the second semiconductor material. For example, the fourth semiconductor pattern 122p and the fifth semiconductor pattern 124p may include at least one of silicon germanium (SiGe), silicon germanium carbide (SiGeC), and germanium (Ge).

In some embodiments, the second semiconductor pattern 126 may not include germanium (Ge). For example, the second semiconductor pattern 126 may include the first semiconductor material. For example, the second semiconductor pattern 126 may include silicon (Si).

The third semiconductor pattern 130 may include a third semiconductor material. The third semiconductor material may be a semiconductor material having an oxidation rate slower than that of the second semiconductor material. For example, the third semiconductor pattern 130 may include silicon (Si).

The first semiconductor pattern 110, the preliminary stress pattern 120p, and the second semiconductor pattern 126 may be formed by patterning a plurality of semiconductor patterns sequentially stacked on the substrate 100 using a mask pattern 310 as an etch mask.

Referring to FIG. 33, the field insulation layer 105 may be formed on sidewalls of the preliminary fin structure FSp.

The field insulation layer 105 may completely cover the sidewalls of the preliminary fin structure FSp.

The field insulation layer 105 may include, for example, silicon oxide, silicon nitride, silicon oxynitride, or a combination thereof, but is not limited thereto.

Referring to FIGS. 34 and 35, the first fin structure FS including the stress pattern 120 may be formed.

For example, the fourth semiconductor pattern 122p and the fifth semiconductor pattern 124p may be oxidized by performing an oxidation process OP. The oxidation process OP may include, for example, a wet oxidation process, but is not limited thereto.

The fourth semiconductor pattern 122p and the fifth semiconductor pattern 124p including silicon germanium (SiGe), silicon germanium carbide (SiGeC), or germanium (Ge) may be oxidized by performing the oxidation process OP to form the first oxide pattern 122 and the second oxide pattern 124, respectively. However, the first semiconductor pattern 110, the second semiconductor pattern 126, and the third semiconductor pattern 130 that each include silicon (Si) having an oxidation rate slower than that of silicon germanium (SiGe), silicon germanium carbide (SiGeC), or germanium (Ge) may not be oxidized by the oxidation process OP. Thus, the stress pattern 120 including the first oxide pattern 122, the second semiconductor pattern 126, and the second oxide pattern 124 may be formed in the first fin structure FS.

Figure 37:
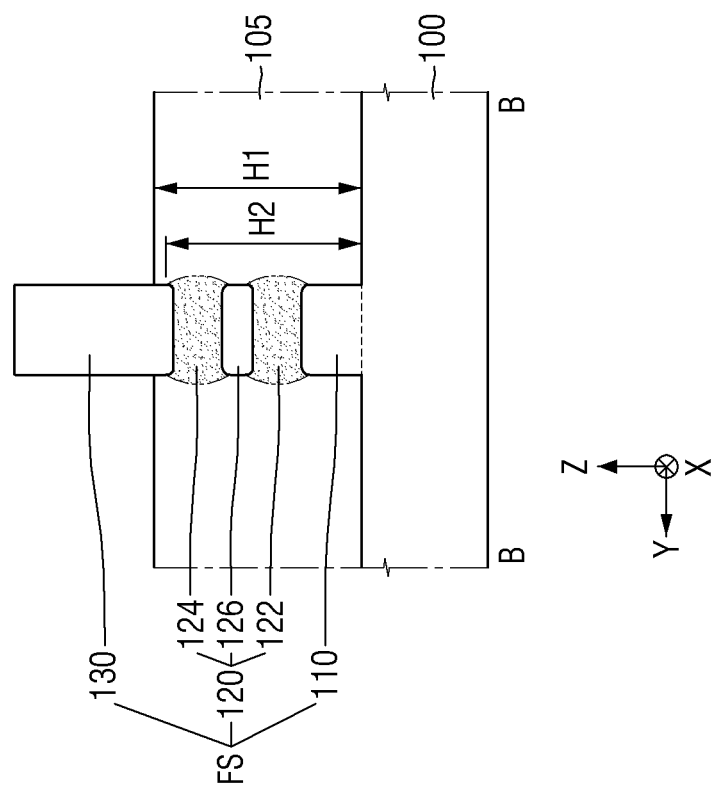

Referring to FIGS. 36 and 37, a recess process may be performed on the field insulation layer 105.

Thus, the field insulation layer 105 may expose at least a portion of the third semiconductor pattern 130.

A height H1 of an upper surface of the field insulation layer 105 may be higher than a height H2 of an uppermost surface of the stress pattern 120, with respect to the upper surface of the substrate 100, but the inventive concepts are not limited thereto. For example, the height H1 of the upper surface of the field insulation layer 105 may be lower than the height H2 of the uppermost surface of the stress pattern 120, with respect to the upper surface of the substrate 100.

In some embodiments, the mask pattern 310 may be removed during or after the recess process.

The first gate structure GS1, the second gate structure GS2, the source/drain regions 150, and the interlayer insulation layer 160 may be formed on the first fin structure FS. Accordingly, the semiconductor device as described with reference to FIGS. 2 and 3 may be fabricated.

Figure 38:
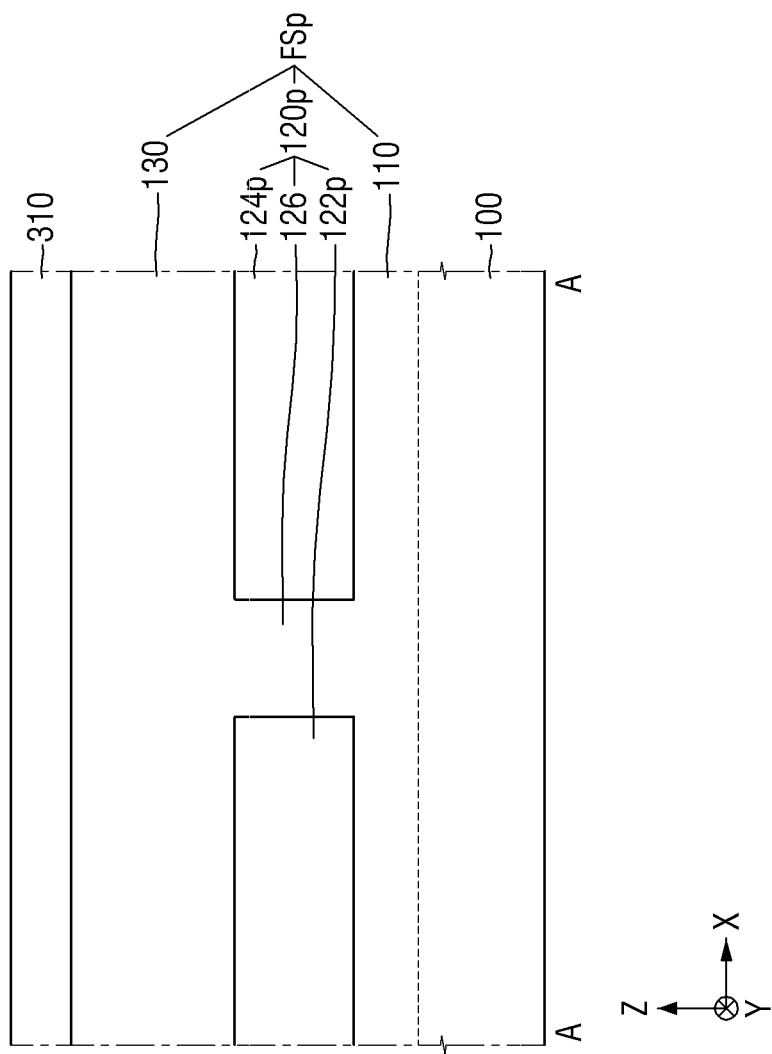
FIGS. 38 and 39 are views illustrating stages in a method of fabricating a semiconductor device according to example embodiments.
Figure 39:
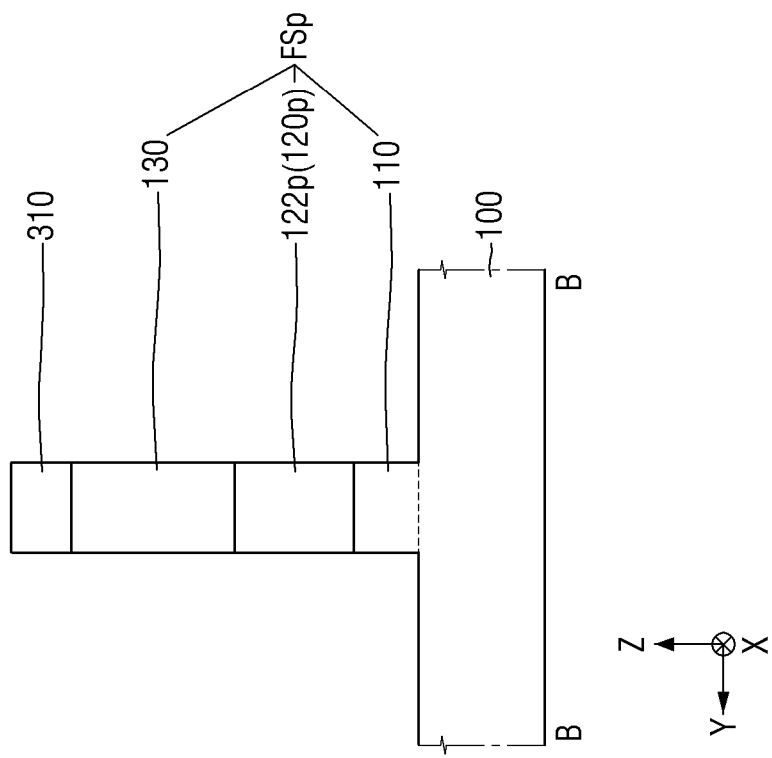

FIGS. 38 to 39 are views illustrating stages in a method of fabricating a semiconductor device according to example embodiments. FIG. 38 is a cross-sectional view taken along line A-A of FIG. 1. FIG. 39 is a cross-sectional view taken along line B-B of FIG. 1. For convenience of explanation, elements duplicated with the examples described above will be described in brief or omitted.

Referring to FIGS. 38 and 39, the preliminary fin structure FSp including the first semiconductor pattern 110, the preliminary stress pattern 120p, and the second semiconductor pattern 126 may be formed on the substrate 100.

The preliminary stress pattern 120p may include the second semiconductor pattern 126, the fourth semiconductor pattern 122p, and the fifth semiconductor pattern 124p. The second semiconductor pattern 126 may be interposed between the fourth semiconductor pattern 122p and the fifth semiconductor pattern 124p.

In some embodiments, the fourth semiconductor pattern 122p, the second semiconductor pattern 126, and the fifth semiconductor pattern 124p may be sequentially arranged in a first direction X. The fourth semiconductor pattern 122p and the fifth semiconductor pattern 124p may each extend in the first direction X.

The same processes as described with reference to FIGS. 33 to 37 may be performed. The first gate structure GS1, the second gate structure GS2, source/drain regions 150, and the interlayer insulation layer 160 may be formed on the first fin structure FS. Accordingly, the semiconductor device described with reference to FIGS. 10 and 11 may be fabricated.

Figure 40:
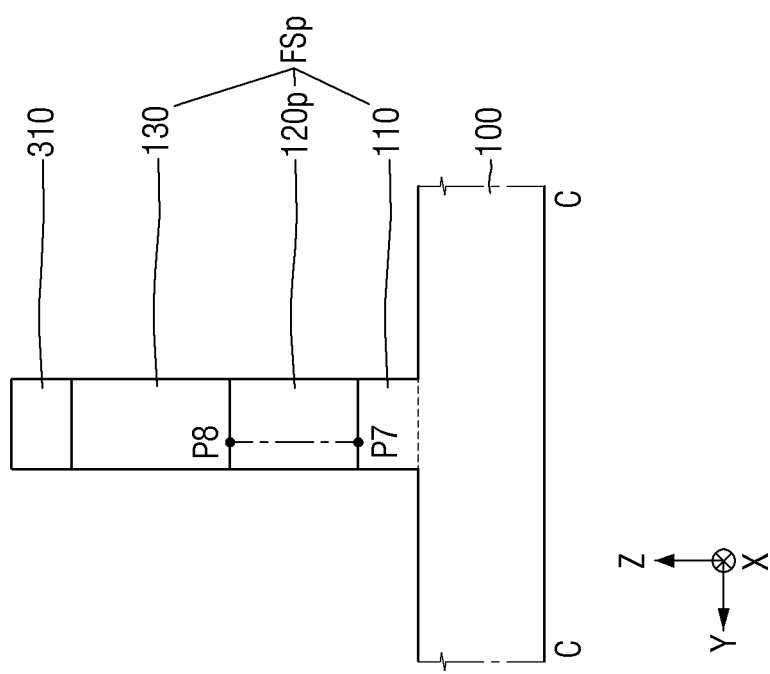
FIG. 40 is a view illustrating a method of fabricating a semiconductor device according to example embodiments.
Figure 41:
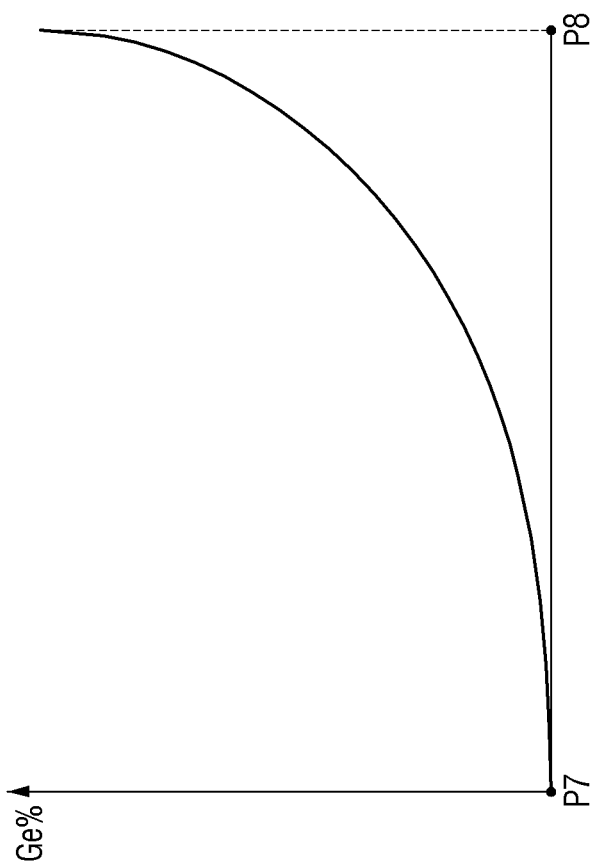
FIGS. 41 and 42 are graphs illustrating a change in a germanium concentration along a scan line P7-P8 of FIG. 40.
Figure 42:
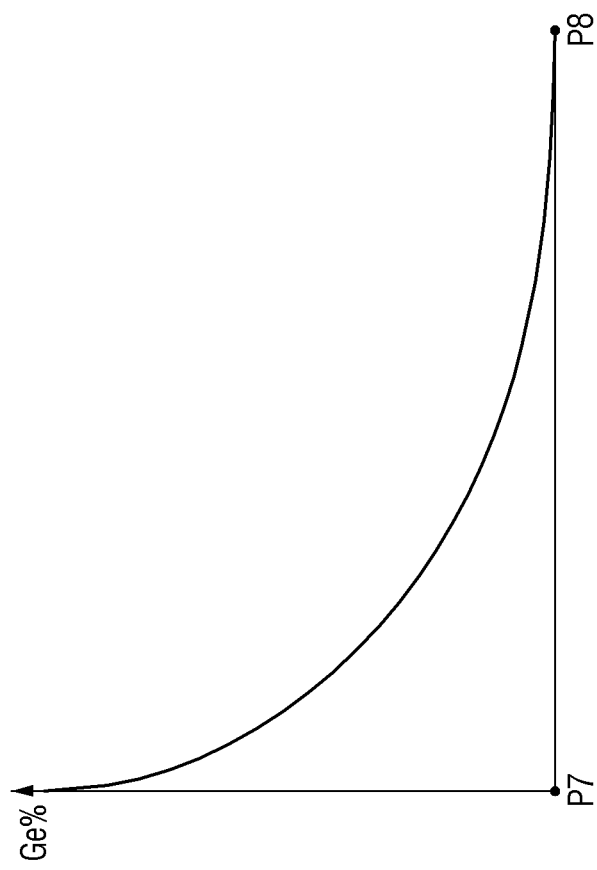

FIGS. 40 to 42 are views illustrating stages in a method of fabricating a semiconductor device according to example embodiments. FIG. 40 is a cross-sectional view taken along line C-C of FIG. 12. FIGS. 41 and 42 are graphs illustrating a change in a germanium concentration along a fourth scan line P7-P8 of FIG. 40. For convenience of explanation, elements duplicated with the examples described above will be described in brief or omitted.

FIG. 40, the preliminary fin structure FSp including the first semiconductor pattern 110, the preliminary stress pattern 120p, and the second semiconductor pattern 126 may be formed.

In some embodiments, the germanium concentration in the preliminary stress pattern 120p may be changed as a distance from the upper surface of the substrate 100 increases. For example, the fourth scan line P7-P8 crossing the preliminary stress pattern 120p in the third direction Z may be defined. The germanium concentration in the preliminary stress pattern 120p may be changed along the fourth scan line P7-P8.

For example, as shown in FIG. 41, the germanium concentration in the preliminary stress pattern 120p may increase along the fourth scan line P7-P8.

Next, the same processes as described with reference to FIGS. 33 to 37 may be performed. The first gate structure GS1, the second gate structure GS2, the source/drain regions 150, and the interlayer insulation layer 160 may be formed on the first fin structure FS. Accordingly, the semiconductor device described with reference to FIGS. 13 and 14 (or 15 and 16) may be fabricated.

For example, as shown in FIG. 42, the germanium concentration in the preliminary stress pattern 120p may decrease along the fourth scan line P7-P8.

Next, the same processes as described with reference to FIGS. 33 to 37 may be performed. The first gate structure GS1, the second gate structure GS2, the source/drain regions 150, and the interlayer insulation layer 160 may be formed on the first fin structure FS. Accordingly, the semiconductor device described with reference to FIG. 15 may be fabricated.

Though the present inventive concepts have been particularly shown and described with reference to example embodiments thereof, it will be understood by those of ordinary skill in the art that various changes in form and details may be made therein without departing from the scope of the present disclosure as defined by the following claims.

What is claimed is:
1. A semiconductor device comprising:
a substrate;
a fin structure comprising a stress pattern and a semiconductor pattern that are sequentially stacked on the substrate;
a field insulation layer on a portion of the fin structure; and
a gate electrode on the fin structure, the gate electrode intersecting the fin structure and extending in a first direction,
wherein the stress pattern comprises a first oxide pattern and a second oxide pattern that are spaced apart from each other in a second direction that is different from the first direction.

2. The semiconductor device of claim 1, wherein the first oxide pattern and the second oxide pattern comprise germanium.

3. The semiconductor device of claim 2, wherein a first germanium concentration in the first oxide pattern is different from a second germanium concentration in the second oxide pattern.

4. The semiconductor device of claim 1,
wherein the semiconductor pattern comprises a first semiconductor pattern, and
wherein the stress pattern further comprises a second semiconductor pattern between the first oxide pattern and the second oxide pattern.

5. The semiconductor device of claim 4, wherein the second semiconductor pattern is free of germanium.

6. The semiconductor device of claim 1,
wherein the semiconductor pattern comprises a first semiconductor pattern,
wherein the fin structure further comprises a second semiconductor pattern between the substrate and the stress pattern, and
wherein the first oxide pattern and the second oxide pattern are between the second semiconductor pattern and the first semiconductor pattern.

7. The semiconductor device of claim 1,
wherein the first direction is parallel to an upper surface of the substrate, and
wherein the second direction is perpendicular to the upper surface of the substrate.

8. The semiconductor device of claim 1, wherein the second direction is a longitudinal extension direction of the fin structure.

9. The semiconductor device of claim 1,
wherein the substrate comprises a base substrate including a semiconductor material and a buried insulation layer on the base substrate, and
wherein the stress pattern directly contacts the buried insulation layer.

10. The semiconductor device of claim 1, wherein the stress pattern is configured to apply a tensile stress to the semiconductor pattern.

11. The semiconductor device of claim 1, wherein the semiconductor pattern comprises a channel region of an NMOS transistor.

12. The semiconductor device of claim 1, further comprising first and second source/drain regions in the semiconductor pattern at opposite first and second sides, respectively, of the gate electrode.

13. A semiconductor device comprising:
a substrate;
a fin structure comprising a stress structure and a first semiconductor region that are sequentially stacked on the substrate;
a field insulation layer on a portion of the fin structure; and a gate electrode on the fin structure and the field insulation layer, the gate electrode intersecting the fin structure, wherein the stress structure comprises:
  a first oxide region including germanium;
  a second oxide region that is spaced apart from the first oxide region, the second oxide region including germanium; and
  a second semiconductor region between the first oxide region and the second oxide region, wherein the second semiconductor region is free of germanium.

14. The semiconductor device of claim 13, wherein the first oxide region, the second semiconductor region, and the second oxide region are sequentially stacked on the substrate.

15. The semiconductor device of claim 13,
  wherein the fin structure extends in a longitudinal direction, and
  wherein the first oxide region, the second semiconductor region, and the second oxide region are sequentially located in the longitudinal direction.

16. The semiconductor device of claim 13, wherein the stress structure directly contacts the substrate.

17. A semiconductor device comprising:
  a substrate;
  a fin structure comprising a stress structure, a first semiconductor region, a second semiconductor region, and a third semiconductor region that are on the substrate, wherein the third semiconductor region is between the substrate and the stress structure;
  a field insulation layer on the fin structure; and
  a gate electrode on the fin structure,
  wherein the stress structure comprises a first oxide region and a second oxide region that are spaced apart from each other, and
  wherein the first oxide region and the second oxide region are between the third semiconductor region and the first semiconductor region.

18. The semiconductor device of claim 17, wherein the first oxide region and the second oxide region comprise germanium.

19. The semiconductor device of claim 18,
  wherein a first germanium concentration in the first oxide region is different from a second germanium concentration in the second oxide region.

20. The semiconductor device of claim 17,
  wherein the second semiconductor region is between the first oxide region and the second oxide region, and
  wherein the second semiconductor region is free of germanium.

* * * * *